United States Patent
Diep et al.

(10) Patent No.: US 9,922,705 B1
(45) Date of Patent: Mar. 20, 2018

(54) REDUCING SELECT GATE INJECTION DISTURB AT THE BEGINNING OF AN ERASE OPERATION

(71) Applicant: SanDisk Technologies LLC, Plano, TX (US)

(72) Inventors: Vinh Diep, San Jose, CA (US); Xuehong Yu, San Jose, CA (US); Zhengyi Zhang, Mountain View, CA (US); Yingda Dong, San Jose, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/621,222

(22) Filed: Jun. 13, 2017

(51) Int. Cl.
| | |
|---|---|
| *G11C 11/34* | (2006.01) |
| *G11C 11/56* | (2006.01) |
| *G11C 16/34* | (2006.01) |
| *G11C 16/04* | (2006.01) |
| *G11C 16/14* | (2006.01) |

(52) U.S. Cl.
CPC ...... *G11C 11/5635* (2013.01); *G11C 16/0483* (2013.01); *G11C 16/14* (2013.01); *G11C 16/3418* (2013.01); *G11C 16/3436* (2013.01); *G11C 16/3445* (2013.01)

(58) Field of Classification Search
CPC ..... G11C 16/0483; G11C 16/16; G11C 16/14; G11C 16/10; G11C 16/3445; G11C 16/344; G11C 16/3409; G11C 11/5635; G11C 16/3459; G11C 16/04; G11C 16/3404; G11C 16/0466; G11C 16/08; G11C 16/26; G11C 11/5642

USPC ........... 365/185.29, 185.17, 185.18, 185.22, 365/185.11, 185.03, 185.19, 185.33, 365/185.2, 185.24, 185.25, 185.27

See application file for complete search history.

(56) References Cited

U.S. PATENT DOCUMENTS

| | | | |
|---|---|---|---|
| 9,019,775 B2 | 4/2015 | Costa et al. | |
| 9,136,005 B2 | 9/2015 | Choe et al. | |
| 9,142,305 B2 | 9/2015 | Dunga et al. | |
| 9,343,159 B2 | 5/2016 | Dong et al. | |
| 9,343,171 B1 | 5/2016 | Sun et al. | |
| 2008/0158960 A1* | 7/2008 | Sekar | G11O 5/146 365/185.09 |
| 2011/0149659 A1 | 6/2011 | Goda et al. | |
| 2012/0033504 A1 | 2/2012 | Sarin et al. | |
| 2013/0314995 A1 | 11/2013 | Dutta et al. | |

OTHER PUBLICATIONS

U.S. Appl. No. 15/403,710, filed Jan. 11, 2017 by Zhang et al.

* cited by examiner

*Primary Examiner* — Thong Q Le
(74) *Attorney, Agent, or Firm* — Vierra Magen Marcus LLP

(57) ABSTRACT

A memory device and associated techniques avoid a disturb of a select gate transistor during an erase operation for memory cells in a string. During the erase operation, a channel gradient near the select gate transistors is reduced when the voltages of the drain and source ends of a memory string are increased to an erase level which charges up the channel. In one approach, the voltage of the word line which is adjacent to a select gate line is temporarily increased. Another approach builds off the first approach by temporarily increasing the voltage of the select gate line at the same time as the increase in the word line voltage.

20 Claims, 17 Drawing Sheets

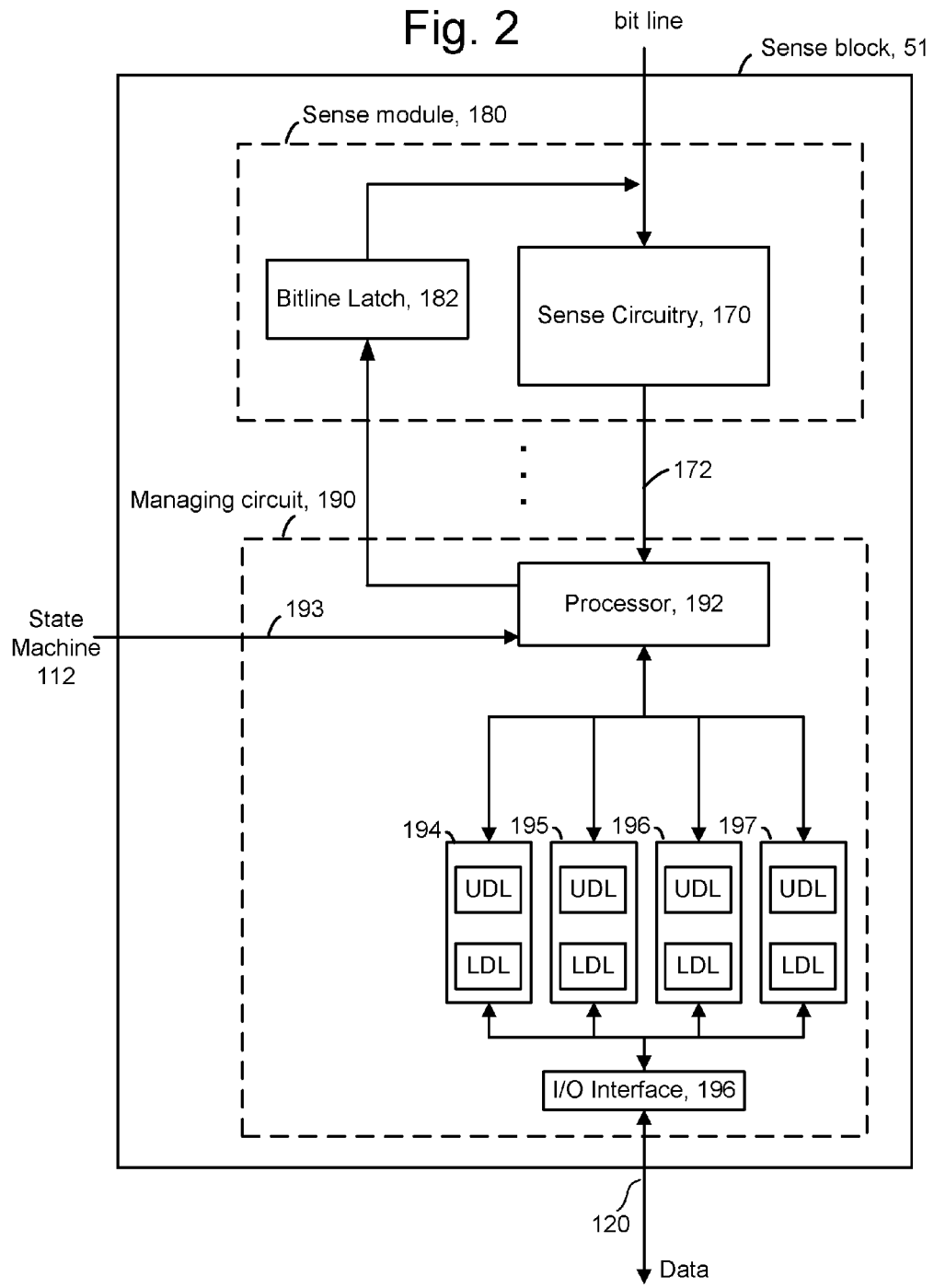

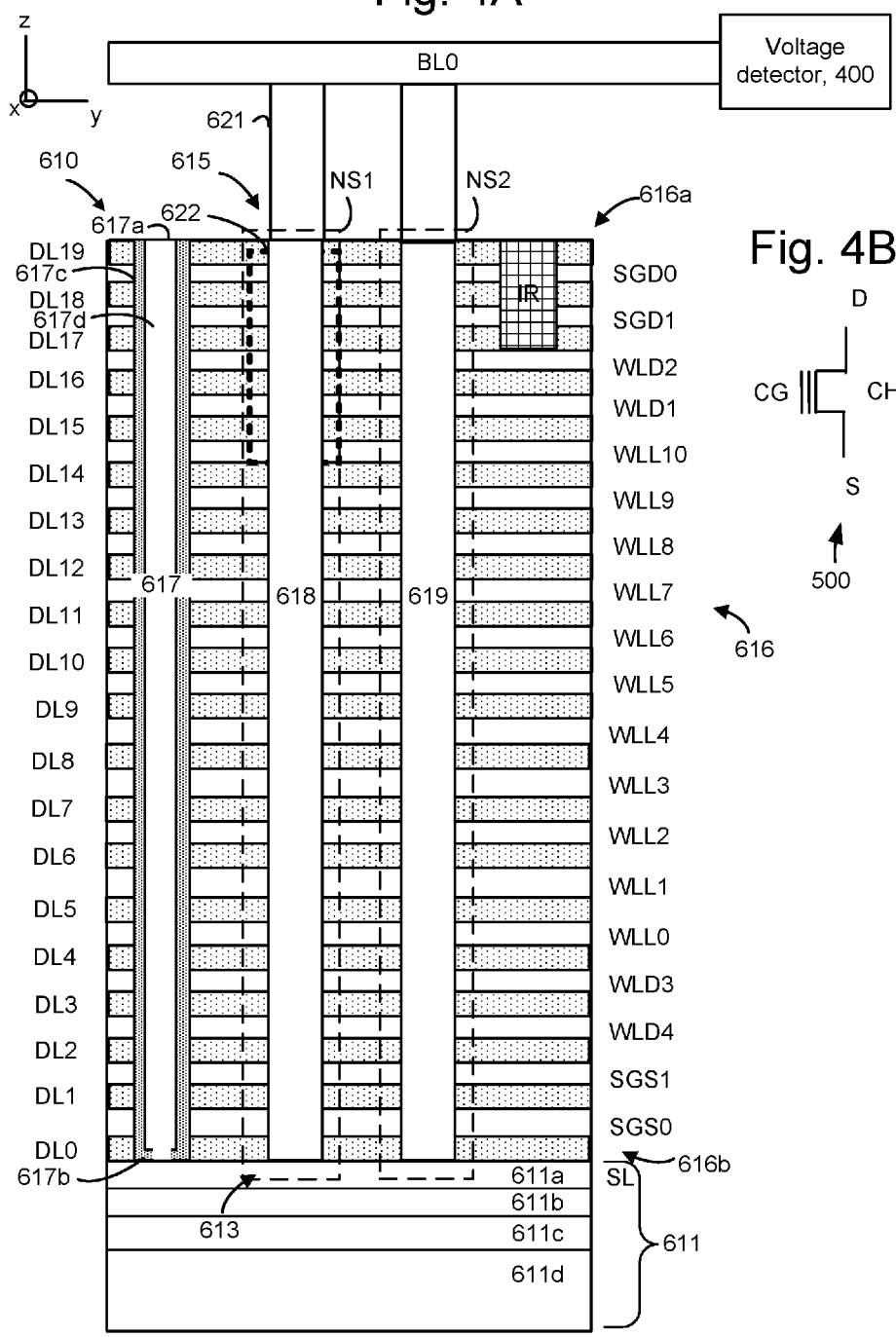
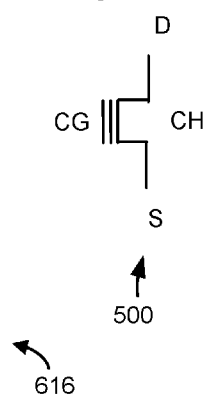

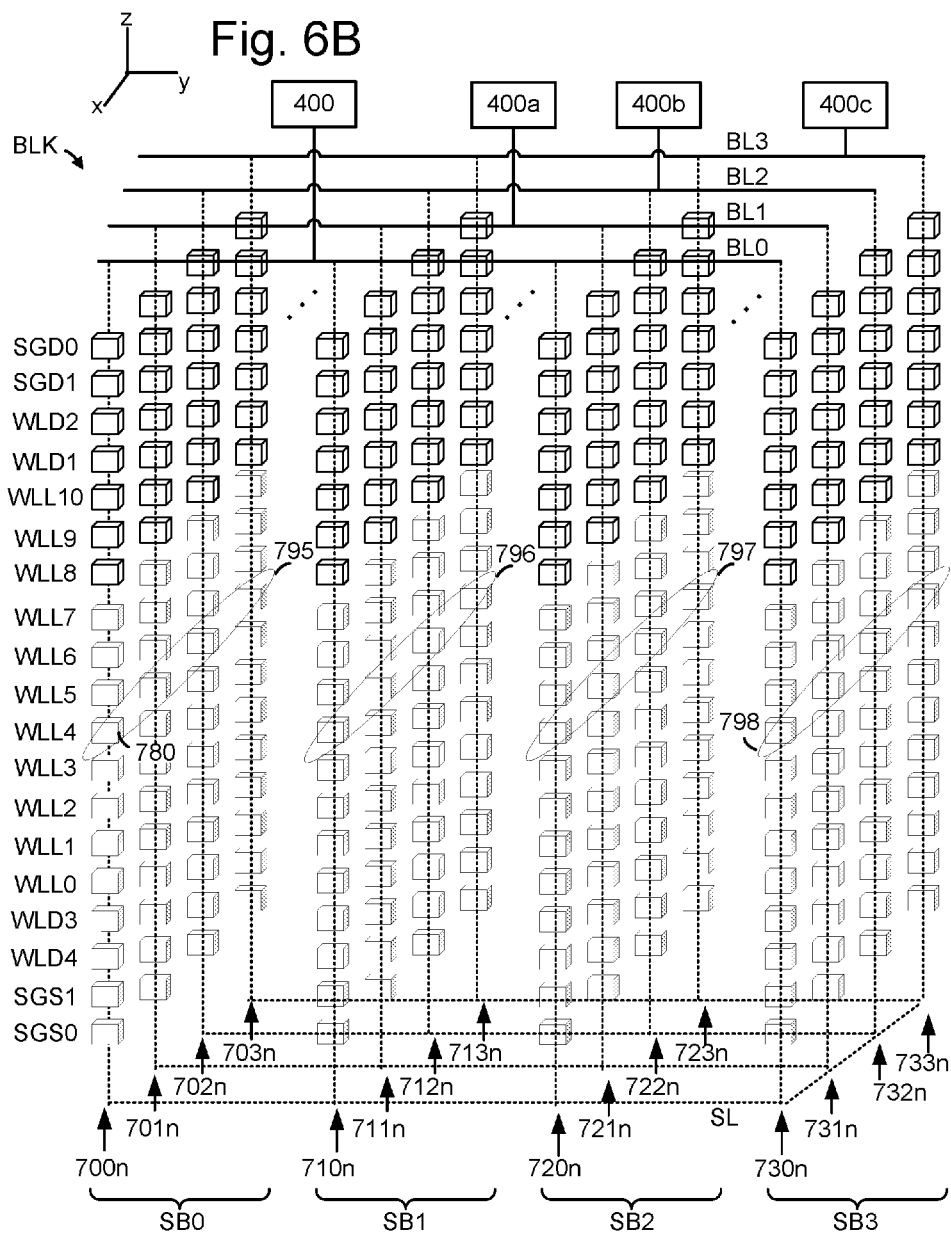

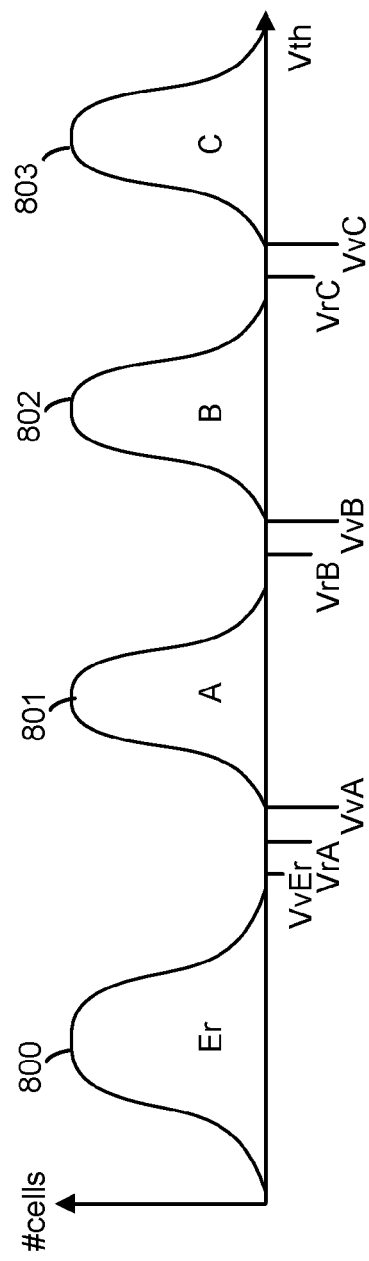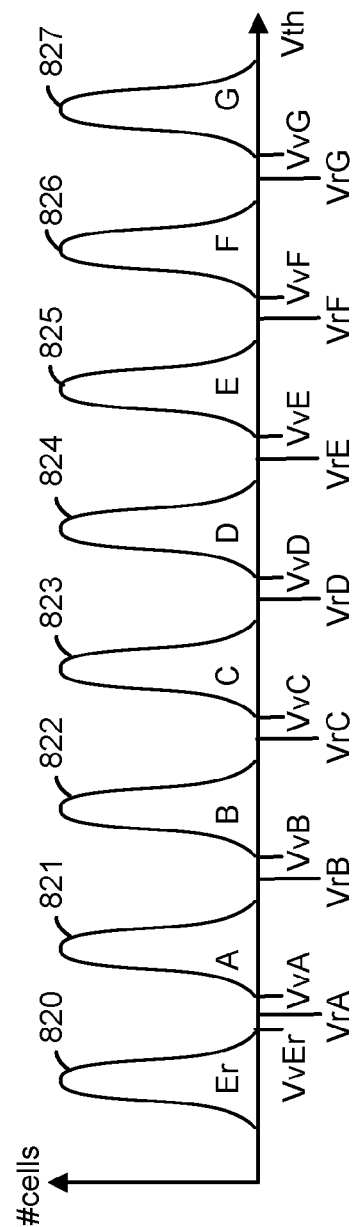

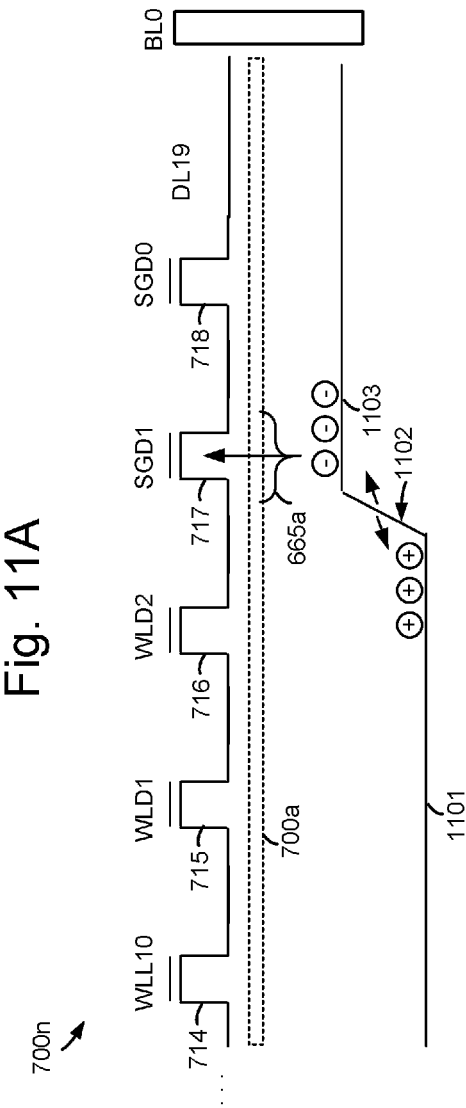

REDUCING SELECT GATE INJECTION DISTURB AT THE BEGINNING OF AN ERASE OPERATION

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in strings, for instance, where select gate transistors are provided at the ends of the string to selectively connect a channel of the string to a source line or bit line. However, various challenges are presented in operating such memory devices.

BRIEF DESCRIPTION OF THE DRAWINGS

FIG. 2 is a block diagram depicting one embodiment of a sense block 51-53 of FIG. 1A.

FIG. 4A depicts an example cross-sectional view of a portion of one of the blocks of FIG. 3.

FIG. 4B depicts an example transistor 500.

FIG. 6B depicts a perspective view of sub-blocks SB0-SB3 consistent with FIG. 6A.

FIG. 7A depicts an example threshold voltage (Vth) distribution of a set of memory cells, where four data states are used.

FIG. 7B depicts an example Vth distribution of a set of memory cells, where eight data states are used.

FIG. 11A depicts a plot of a channel voltage versus memory string position during an erase operation, showing a channel gradient which injects electrons into an SGD transistor in a first disturb mechanism.

FIG. 11B depicts a plot of a channel voltage versus memory string position during an erase operation, showing a channel gradient which injects electrons into a region near an SGD transistor in a second disturb mechanism.

FIG. 13A depicts a source line voltage (Vsl) and a bit line voltage (Vbl), FIG. 13B depicts one option for a drain side select gate voltage (Vsgd) and a source side select gate voltage (Vsgs), FIG. 13C depicts a word line voltage (Vwl_adj) for a word line which is adjacent to an SGD control line, FIG. 13D depicts a word line voltage (Vwl_non-adj) for word lines which are non-adjacent to an SGD control line, and FIG. 13E depicts another option for Vsgd and Vsgs.

DETAILED DESCRIPTION

Figure 1A:
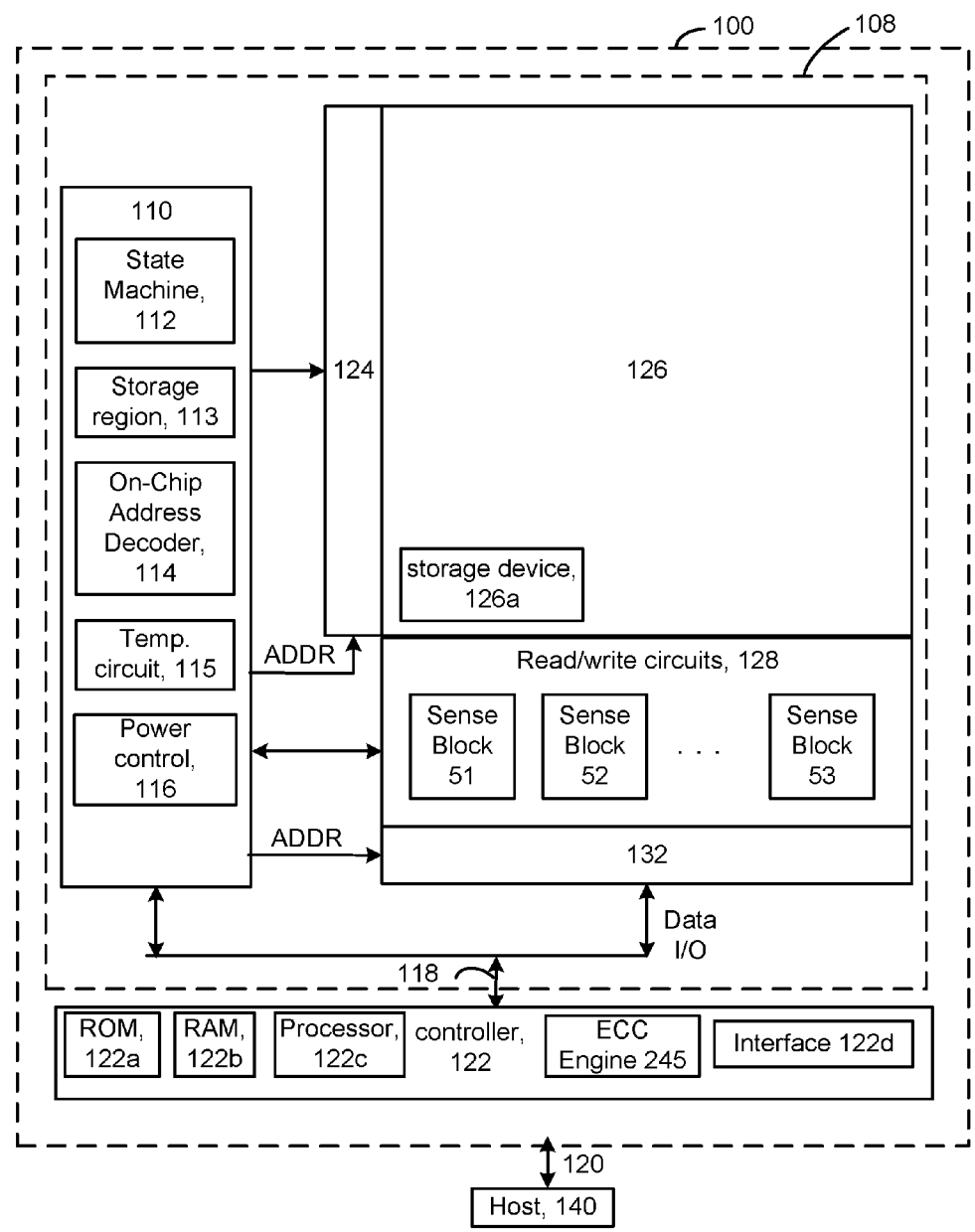
FIG. 1A is a block diagram of an example memory device.

Apparatuses and techniques are described for avoiding disturbs of select gate transistors during an erase operation for a block of memory cells.

In some memory devices, memory cells are joined to one another such as in NAND strings in a block or sub-block. Each NAND string comprises a number of memory cells connected in series between one or more drain-side SG transistors (SGD transistors), on a drain-side of the NAND string which is connected to a bit line, and one or more source-side SG transistors (SGS transistors), on a source-side of the NAND string which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical strings in a stack, where the stack comprises alternating conductive and dielectric layers. The conductive layers act as word lines which are connected to the memory cells.

The memory cells can include data memory cells, which are eligible to store user data, and dummy or non-data memory cells which are ineligible to store user data. A dummy word line is connected to a dummy memory cell. One or more dummy memory cells may be provided at the drain and/or source ends of a string of memory cells to provide a gradual transition in the channel voltage gradient.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations. Verify operations may be performed after each program voltage to determine whether the memory cells have completed programming. When programming is completed for a memory cell, it can be locked out from further programming while programming continues for other memory cells in subsequent program loops.

The memory cells may also be programmed according to a sub-block programming order, where memory cells in one sub-block, or portion of a block, are programmed before programming memory cells in another sub-block.

Each memory cell may be associated with a data state according to write data in a program command. Based on its data state, a memory cell will either remain in the erased state or be programmed to a programmed data state. For example, in a one bit per cell memory device, there are two data states including the erased state and the programmed state. In a two-bit per cell memory device, there are four data states including the erased state and three higher data states referred to as the A, B and C data states (see FIG. 7A). In a three-bit per cell memory device, there are eight data states including the erased state and seven higher data states referred to as the A, B, C, D, E, F and G data states (FIG. 7B). In a four-bit per cell memory device, there are sixteen data states including the erased state and fifteen higher data states.

After the memory cells are programmed, the data can be read back in a read operation. A read operation can involve applying a series of read voltages to a word line while sensing circuitry determines whether cells connected to the word line are in a conductive or non-conductive state. If a cell is in a non-conductive state, the Vth of the memory cell exceeds the read voltage. The read voltages are set at levels which are expected to be between the threshold voltage levels of adjacent data states.

When new data is to be written to a block, the block is erased. This involves boosting the channel voltage while holding the control gates of the memory cells at a low voltage such as 0-0.5 V. Various approaches can be used to boost the channel voltage. One approach raises the voltage of a substrate at a source end of the memory strings. Additionally, the control gate voltage of a source side select gate transistor (SGS transistor) of each memory string is controlled to allow holes (positive charges) to enter the channel. The substrate is the primary source of holes to charge up the channel. A voltage can also be applied to the drain ends of the memory strings via bit lines, to help boost the channel voltage.

However, the voltage on the bit lines typically increases to the requested level quickly due to the metal composition of the bit lines and the corresponding low resistance. On the other hand, the substrate voltage increases more slowly due to the large capacitance of the substrate. Moreover, it takes some time for the drain end of the channel to be charged up by the holes which are passed from the substrate into the source end of the channel. As a result, a channel gradient can be generated near the SGD transistors. The channel gradient can generate electron-hole pairs in which the electrons are drawn into the charge trapping layer near the SGD transistors, raising the threshold voltage of these transistors. See FIGS. 11A and 11B. This is a type of disturb.

Techniques provided herein address the above and other issues. In one aspect, a channel gradient is reduced when the voltages of the drain and source ends of a memory string are increased to an erase level which charges up the channel. In one approach, the voltage of the word line which is adjacent to a select gate line is temporarily increased. See, e.g., FIG. 13C. Another approach builds off the first approach by temporarily increasing the voltage of the select gate line at the same time as the increase in the word line voltage. See, e.g., FIG. 13E.

These and other features are discussed herein.

FIG. 1A is a block diagram of an example memory device. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . , 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, a temperature-sensing circuit 115, and a power control module 116. The state machine 112 provides chip-level control of memory operations. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The temperature-sensing circuit may detect a temperature of the memory device. See FIG. 1B for further details of a temperature-sensing circuit.

The power control module 116 controls the power and voltages supplied to the word lines, select gate lines, bit lines and source lines during memory operations. It can include drivers for word lines, SGS and SGD transistors and source lines. The sense blocks can include bit line drivers, in one approach. An SGS transistor is a select gate transistor at a source end or source side of a NAND string, and an SGD transistor is a select gate transistor at a drain-end or drain side of a NAND string.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 116, sense blocks 51, 52, . . . , 53, read/write circuits 128, controller 122, and so forth.

The off-chip controller 122 (which in one embodiment is an electrical circuit) may comprise a processor 122c, storage devices (memory) such as ROM 122a and RAM 122b and an error-correction code (ECC) engine 245. The ECC engine can correct a number of read errors.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 1B:
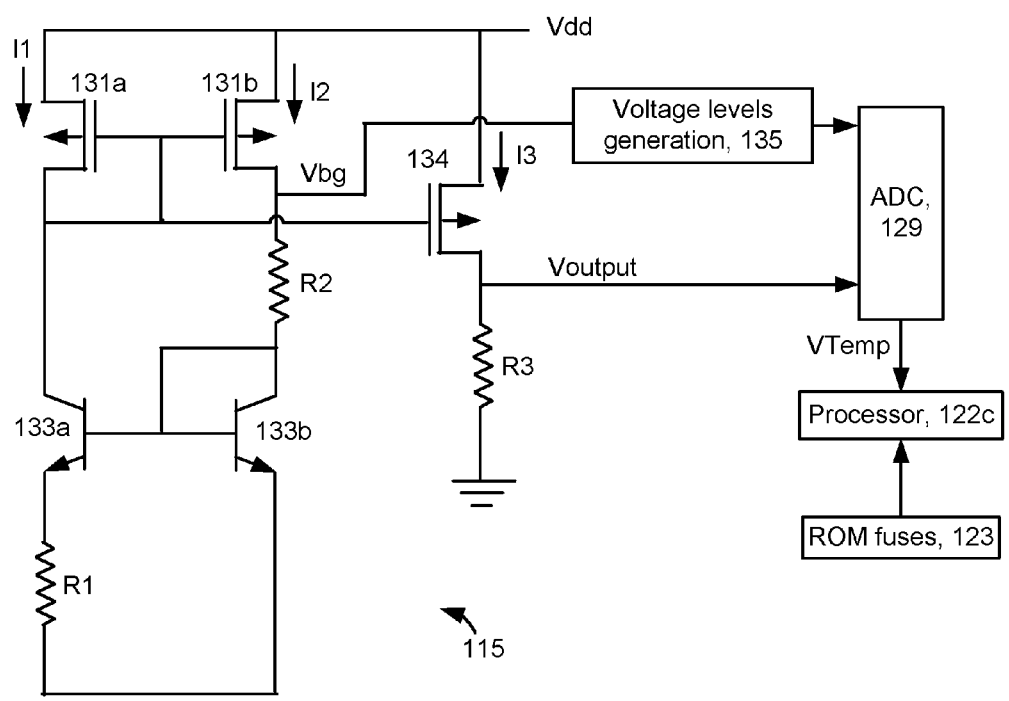
FIG. 1B depicts an example of the temperature-sensing circuit 115 of FIG. 1A.

FIG. 1B depicts an example of the temperature-sensing circuit 115 of FIG. 1A. The circuit includes pMOSFETs 131a, 131b and 134, bipolar transistors 133a and 133b and resistors R1, R2 and R3. I1, I2 and I3 denote currents. Voutput is a temperature-based output voltage provided to an analog-to-digital (ADC) converter 129. Vbg is a temperature-independent voltage. A voltage level generation circuit 135 uses Vbg to set a number of voltage levels. For example, a reference voltage may be divided down into several levels by a resistor divider circuit.

The ADC compares Voutput to the voltage levels and selects a closest match among the voltage levels, outputting a corresponding digital value (VTemp) to the processor. This is data indicating a temperature of the memory device. ROM fuses 123 store data which correlates the matching voltage level to a temperature, in one approach. The processor then uses the temperature to set temperature-based parameters in the memory device.

Vbg, is obtained by adding the base-emitter voltage (Vbe) across the transistor 131b and the voltage drop across the resistor R2. The bipolar transistor 133a has a larger area (by a factor N) than the transistor 133b. The PMOS transistors 131a and 131b are equal in size and are arranged in a current mirror configuration so that the currents I1 and I2 are substantially equal. We have Vbg=Vbe+R2×I2 and I1=Ve/R1 so that I2=Ve/R1. As a result, Vbg=Vbe+R2×kT ln(N)/R1×q, where T is temperature, k is Boltzmann's constant and q is a unit of electric charge. The source of the transistor 134 is connected to a supply voltage Vdd and the node between the transistor's drain and the resistor R3 is the output voltage, Voutput. The gate of the transistor 134 is connected to the same terminal as the gates of transistors 131a and 131b and the current through the transistor 134 mirrors the current through the transistors 131a and 131b.

FIG. 2 is a block diagram depicting one embodiment of a sense block 51-53 of FIG. 1A. An individual sense block 51 is partitioned into one or more core portions, referred to as sense modules 180 or sense amplifiers, and a common portion, referred to as a managing circuit 190. In one embodiment, there will be a separate sense module 180 for each bit line and one common managing circuit 190 for a set of multiple, e.g., four or eight, sense modules 180. Each of the sense modules in a group communicates with the associated managing circuit via data bus 172. Thus, there are one or more managing circuits which communicate with the sense modules of a set of storage elements.

Sense module 180 comprises sense circuitry 170 that performs sensing by determining whether a conduction current in a connected bit line is above or below a predetermined threshold level. Sense module 180 also includes a bit line latch 182 that is used to set a voltage condition on the connected bit line. For example, a predetermined state latched in bit line latch 182 will result in the connected bit line being pulled to a state designating program inhibit (e.g., 1.5-3 V). As an example, a flag=0 can inhibit programming, while flag=1 does not inhibit programming.

Managing circuit 190 comprises a processor 192, four example sets of data latches 194-197 and an I/O Interface 196 coupled between the set of data latches 194 and data bus 120. One set of data latches can be provide for each sense module, and data latches identified by LDL and UDL may be provided for each set. In some cases, additional data latches may be used. LDL stores a bit for a lower page of data, and UDL stores a bit for an upper page of data. This is in a four-level or two-bits per storage element memory device. One additional data latch per bit line can be provided for each additional data bit per storage element.

Processor 192 performs computations, such as to determine the data stored in the sensed storage element and store the determined data in the set of data latches. Each set of data latches 194-197 is used to store data bits determined by processor 192 during a read operation, and to store data bits imported from the data bus 120 during a programming operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed storage element. As it steps through the various predefined control gate voltages corresponding to the various memory states supported by the memory, the sense module 180 may trip at one of these voltages and a corresponding output will be provided from sense module 180 to processor 192 via bus 172. At that point, processor 192 determines the resultant memory state by consideration of the tripping event(s) of the sense module and the information about the applied control gate voltage from the state machine via input lines 193. It then computes a binary encoding for the memory state and stores the resultant data bits into data latches 194-197. In another embodiment of the managing circuit 190, bit line latch 182 serves double duty, both as a latch for latching the output of the sense module 180 and also as a bit line latch as described above.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations, the data to be programmed (write data) is stored in the set of data latches 194-197 from the data bus 120, in the LDL and UDL latches, in a two-bit per storage element implementation. In a three-bit per storage element implementation, an additional data latch may be used. The programming operation, under the control of the state machine, comprises a series of programming voltage pulses applied to the control gates of the addressed storage elements. Each program pulse is followed by a read back (verify) to determine if the storage element has been programmed to the desired memory state. In some cases, processor 192 monitors the read back memory state relative to the desired memory state. When the two are in agreement, the processor 192 sets the bit line latch 182 so as to cause the bit line to be pulled to a state designating program inhibit. This inhibits the storage element coupled to the bit line from further programming even if program pulses appear on its control gate. In other embodiments the processor initially loads the bit line latch 182 and the sense circuitry sets it to an inhibit value during the verify process.

Each set of data latches 194-197 may be implemented as a stack of data latches for each sense module. In one embodiment, there are three data latches per sense module 180. In some implementations, the data latches are implemented as a shift register so that the parallel data stored therein is converted to serial data for data bus 120, and vice versa. All the data latches corresponding to the read/write block of storage elements can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

The data latches identify when an associated storage element has reached certain mileposts in a programming operations. For example, latches may identify that a storage element's Vth is below a particular verify level. The data latches indicate whether a storage element currently stores one or more bits from a page of data. For example, the LDL latches can be used to store a lower page of data. An LDL latch is flipped (e.g., from 0 to 1) when a lower page bit is stored in an associated storage element. A UDL latch is flipped when an upper page bit is stored in an associated storage element. This occurs when an associated storage element completes programming, e.g., when its Vth exceeds a target verify level such as VvA, VvB or VvC.

Figure 3:
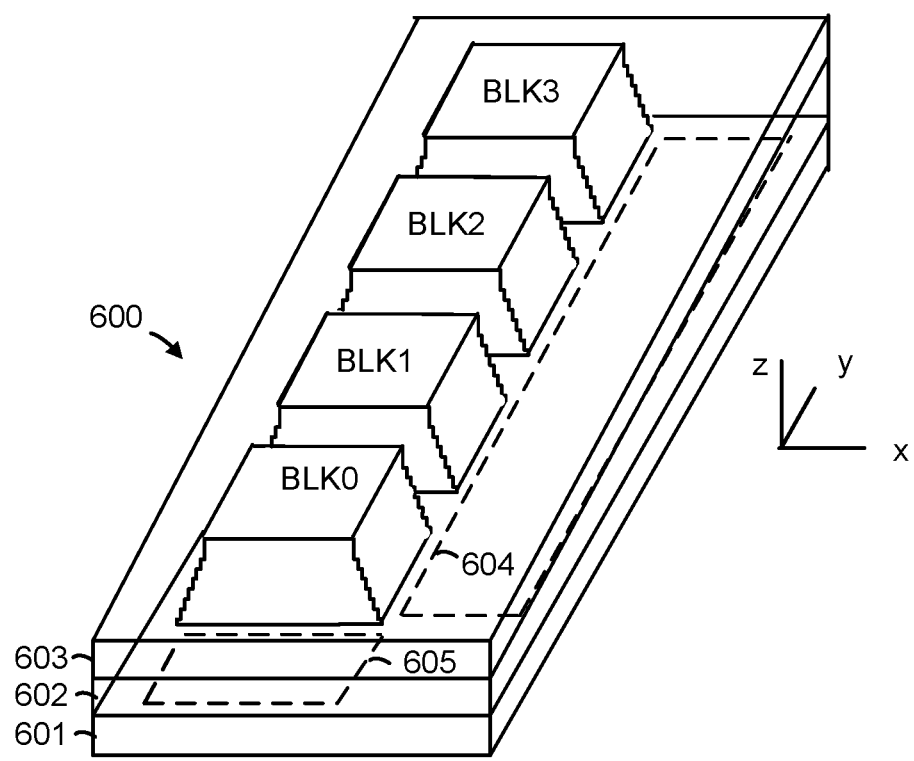
FIG. 3 is a perspective view of a memory device 600 comprising a set of blocks in a plane in an example 3D configuration of the memory structure 126 of FIG. 1A.

FIG. 3 is a perspective view of a memory device 600 comprising a set of blocks in a plane in an example 3D configuration of the memory structure 126 of FIG. 1A. On the substrate 601 are example blocks BLK0, BLK1, BLK2 and BLK3 of memory cells (storage elements) and peripheral areas with circuitry for use by the blocks. The peripheral area 604 runs along an edge of each block while the peripheral area 605 is at an end of the set of blocks.

The circuitry can include voltage drivers which can be connected to control gate layers, bit lines and source lines of the blocks. The substrate can also carry circuitry under the blocks, along with one or more lower metal layers which are patterned in conductive paths to carry signals of the circuitry. The blocks are formed in an intermediate region 602 of the memory device. In an upper region 603 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions. Typically, the length of the blocks is much longer in the x-direction than the width in the y-direction.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

FIG. 4A depicts an example cross-sectional view of a portion of one of the blocks of FIG. 3. The block comprises a stack 610 of alternating conductive and dielectric layers. The block comprises conductive layers spaced apart vertically, and the conductive layers comprise word lines connected to the memory cells and select gate lines connected to SGD and SGS transistors.

In this example, the conductive layers or plates comprise two SGD layers, two SGS layers and four dummy word line layers (or word lines) WLD1, WLD2, WLD3 and WLD4, in addition to data word line layers (or word lines) WLL0-WLL10. WLD2 is a topmost dummy word line layer, and WLD1 is another dummy word line layer which is below the topmost dummy word line layer and above the topmost or drain-side data word line WLL10. WLD3 and WLD4 are source side dummy word line layers. The dielectric layers are labelled as DL0-DL19. Further, regions of the stack which comprise NAND strings NS1 and NS2 are depicted. Each NAND string encompasses a memory hole 618 or 619 which is filled with materials which form memory cells adjacent to the word lines. A region 622 of the stack is shown in greater detail in FIG. 5.

The stack includes a substrate 611. In one approach, a portion of the source line SL comprises an n-type source diffusion layer 611a in the substrate which is in contact with a source end of each string of memory cells in a block. The n-type source diffusion layer 611a is formed in a p-type well region 611b, which in turn is formed in an n-type well region 611c, which in turn is formed in a p-type semiconductor substrate 611d, in one possible implementation. The n-type source diffusion layer may be shared by all of the blocks in a plane, in one approach.

NS1 has a source-end 613 at a bottom 616b of the stack 616 or the plurality of word line layers and a drain-end 615 at a top 616a of the stack or the plurality of word line layers. Local interconnects, such as interconnect 617, may be provided periodically across the stack. The local interconnects may be metal-filled slits which extend through the stack, such as to connect the source line/substrate to a line above the stack. The metal 617d is isolated from the word line layers by an insulating material 617c. The slits may be used during the formation of the word lines and subsequently filled with metal. Specifically, a stack may be formed with a sacrificial material such as SiN for the word lines layers alternating with dielectric layers such as oxide. Slits are etched periodically in the stack down to the substrate, thereby exposing portions of the sacrificial material. An etchant such as hot phosphoric acid is deposited in the slits to remove the sacrificial material, forming voids. A metal is then deposited in the voids via the slits, thus forming the final word line layers. Subsequently, the metal in the slits is cleaned away and the insulating material 617c is deposited along the sidewalls of the slits. A hole is etched in the bottom of the insulation layer. The remainder of the slits is filled with the metal 617d which extends through the hole to the substrate and up to the top of the stack, thus forming a conductive path or local interconnect from the bottom to the top of the stack.

A portion of a bit line BL0 is also depicted. A conductive via connects the drain-end of each memory string to a bit line. For example, a conductive via 621 connects the drain-end 615 to BL0. The local interconnect 617 has a top 617a and a bottom 617b. The bottom is etched through to provide a contact to the substrate.

In one approach, the block of memory cells comprises a stack of alternating control gate and dielectric layers, and the memory cells are arranged in vertically extending memory holes in the stack.

In one approach, each block comprises a terraced edge in which vertical interconnects, e.g., pillars or posts, connect to each layer, including the SGS, WL and SGD layers, and extend upward to horizontal paths to voltage sources.

This example includes two SGD transistors, two drain side dummy memory cells, two source side dummy memory cells and two SGS transistors in each string, as an example. Generally, one or more SGD transistors and one or more SGS transistors may be provided in a memory string. Also, the use of dummy memory cells is optional.

An isolation region IR may be provided to separate portions of the SGD layers from one another to provide one independently driven SGD line or layer portion per sub-block. The isolation region comprises an insulating material such as oxide. In one example, the word line layers are common to all sub-blocks in a block.

FIG. 4B depicts an example transistor 500. The transistor comprises a control gate CG, a drain D, a source S and a channel CH. During a programming operation, the transistor has a positive gate-to-channel voltage. During an erase operation, the transistor has a positive channel-to-gate voltage.

Figure 5:
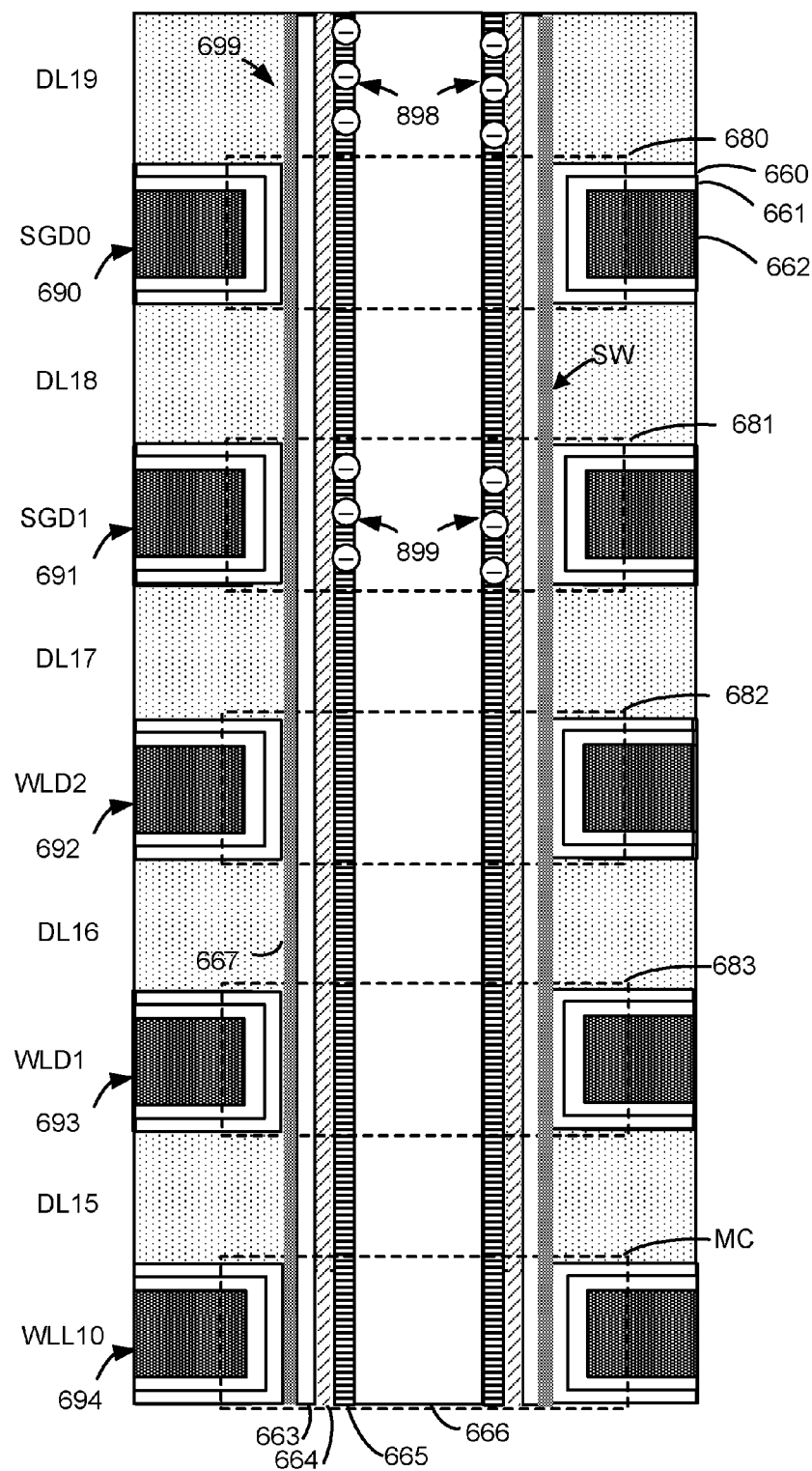
FIG. 5 depicts a close-up view of the region 622 of the stack of FIG. 4A.

FIG. 5 depicts a close-up view of the region 622 of the stack of FIG. 4A. Memory cells are formed at the different levels of the stack at the intersection of a word line layer and a memory hole. In this example, SGD transistors 680 and 681 are provided above dummy memory cells 682 and 683 and a data memory cell MC. A number of layers can be deposited along the sidewall (SW) of the memory hole and/or within each word line layer, e.g., using atomic layer deposition. For example, each pillar 699 or column which is formed by the materials within a memory hole can include a blocking oxide 667, a charge-trapping layer 663 or film such as silicon nitride ($Si_3N_4$) or other nitride, a tunneling layer 664 (such as oxide), a channel layer 665 (e.g., comprising polysilicon), and a dielectric core 666. A word line layer can include a block high-k material 660, a metal barrier 661, and a conductive metal 662 such as Tungsten as a control gate. For example, control gates 690, 691, 692, 693 and 694 are provided. Additional pillars are similarly formed in the different memory holes. The pillar 699 can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

Figure 10:
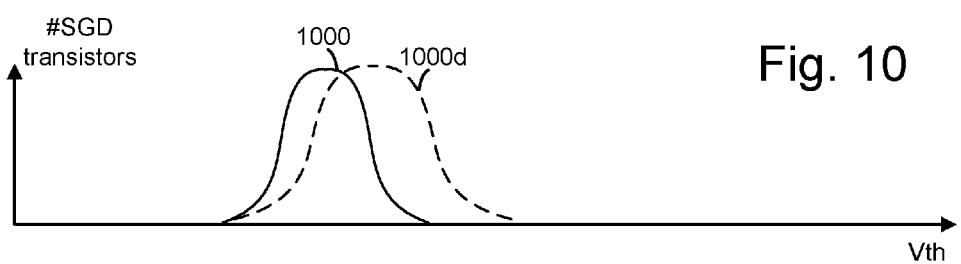
FIG. 10 depicts an example Vth distribution of a set of SGD transistors with and without a disturb.

As mentioned at the outset, a channel gradient may be formed which causes a disturb of the SGD transistor 680. In particular, in one disturb mechanism, electrons 898 can be injected into the charge trapping layer on the drain side of the SGD transistors, e.g., above the transistors in a core height region of the stack. This region may be associated with D19, for instance. See also FIG. 11B. Once injected, the electrons cannot be removed by an erase operation for the SGD transistors because the portion of the charge trapping layer in which the electrons are injected is not directly adjacent to a control gate layer. This results in an increase in the upper tail of the Vth distribution of the SGD transistors, as shown in FIG. 10. Moreover, the increase in the upper tail becomes worse as program-erase cycles accumulate for a block.

Additionally, in another disturb mechanism, electrons 899 can be injected into the charge trapping layer of the bottommost SGD transistor 681, if there is more than one SGD transistor in a memory string. If there is only one SGD transistor in a memory string, the electrons 899 can be injected into the charge trapping layer of that single SGD transistor. See also FIG. 11A.

Figure 6A:
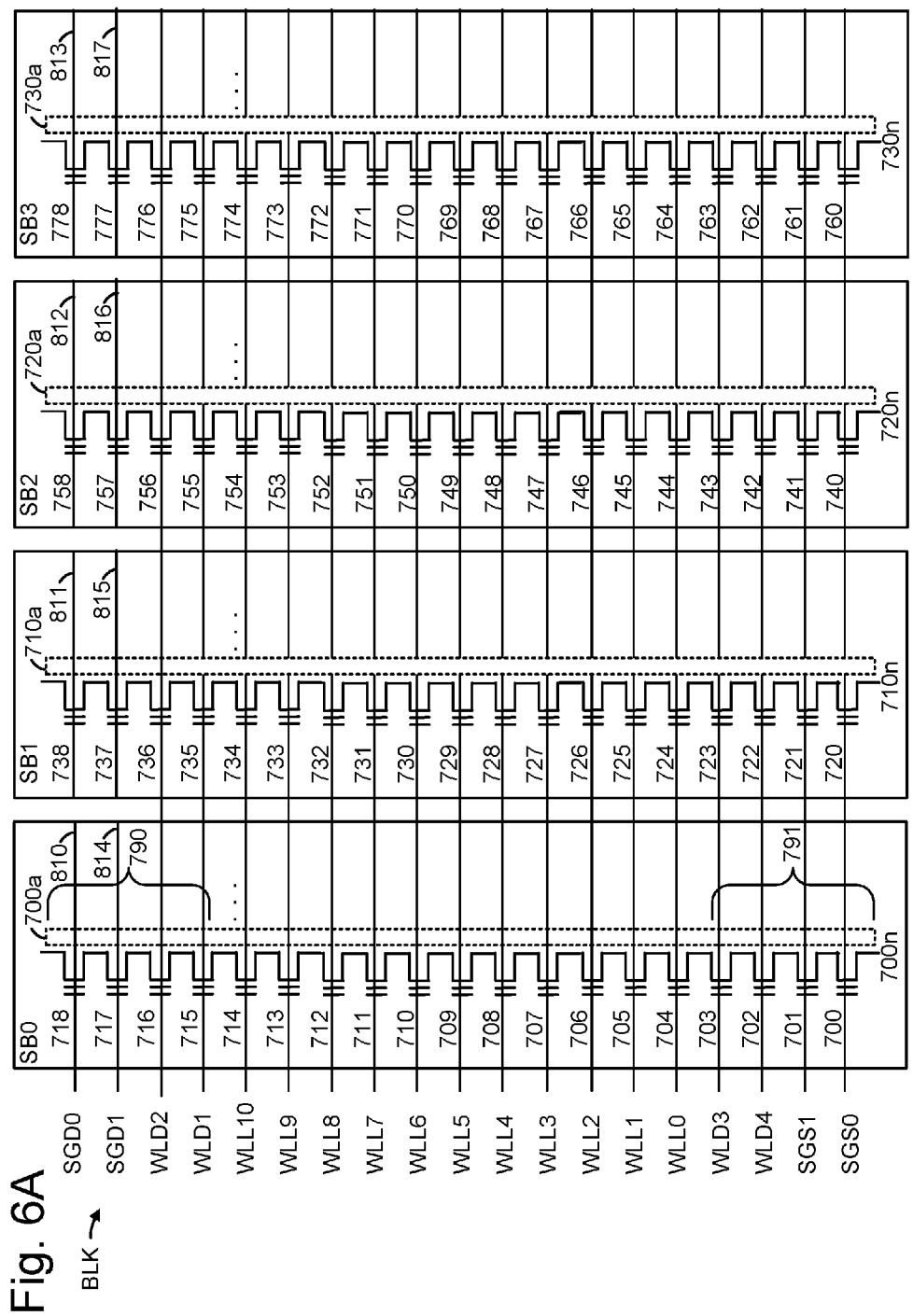
FIG. 6A depicts an example implementation of the memory structure 126 of FIG. 1A comprising NAND strings in sub-blocks in a 3D configuration.

FIG. 6A depicts an example implementation of the memory structure 126 of FIG. 1A comprising NAND strings in sub-blocks in a 3D configuration. In one approach, a block BLK of memory cells is formed from a stack of alternating conductive and dielectric layers. The block comprises conductive layers spaced apart vertically, and the conductive layers spaced apart vertically comprise word lines connected to the memory cells and select gate lines connected to SGD (drain-side select gate) and SGS (source-side select gate) transistors. In this example, the conductive layers comprise two SGD layers, two SGS layers and four dummy word line layers (or word lines) WLD1, WLD2, WLD3 and WLD4, in addition to data word line layers (or word lines) WLL0-WLL10. The dielectric layers are labelled as DL0-DL19. Each NAND string may be formed in a memory hole in the stack is filled with materials which form memory cells adjacent to the word lines.

Further, each block can be divided into sub-blocks and each sub-block includes multiple NAND strings, where one example NAND string is depicted. For example, sub-blocks SB0, SB1, SB2 and SB3 comprise example NAND strings 700n, 710n, 720n and 730n, respectively. The NAND strings have data word lines, dummy word lines and select gate lines. Each sub-block comprises a set of NAND strings which extend in the x direction and which have a common SGD line. SB0 has SGD lines or SGD layer portions 810 and 814 in the SGD0 and SGD1 layers, respectively. SB1 has SGD layer portions 811 and 815 in the SGD0 and SGD1 layers, respectively. SB2 has SGD layer portions 812 and 816 in the SGD0 and SGD1 layers, respectively. SB3 has SGD layer portions 813 and 817 in the SGD0 and SGD1 layers, respectively. Each of the data word line layers WLL0 to WLL10 and the SGS layers SGS0 and SGS1 is shared by all of the sub-blocks SB0 to SB3. The dummy word line layers are also shared by all of the sub-blocks.

The NAND strings 700n, 710n, 720n and 730n are in sub-blocks SB0, SB1, SB2 and SB3, respectively. Programming of the block may occur one sub-block at a time. Within each sub-block, a word line programming order may be followed, e.g., starting at WL0, the source-side word line and proceeding one word line at a time to WLL10, the drain-side word line.

The NAND strings 700n, 710n, 720n and 730n have channels 700a, 710a, 720a and 730a, respectively. Each channel has a drain end and a source end. For example, the channel 700a has a drain end 790 and a source end 791.

Additionally, NAND string 700n includes SGS transistors 700 and 701, dummy memory cells 702 and 703, data memory cells 704, 705, 706, 707, 708, 709, 710, 711, 712, 713 and 714, dummy memory cells 715 and 716, and SGD transistors 717 and 718.

NAND string 710n includes SGS transistors 720 and 721, dummy memory cells 722 and 723, data memory cells 724, 725, 726, 727, 728, 729, 730, 731, 732, 733 and 734, dummy memory cells 735 and 736, and SGD transistors 737 and 738.

NAND string 720n includes SGS transistors 740 and 741, dummy memory cells 742 and 743, data memory cells 744, 745, 746, 747, 748, 749, 750, 751, 752, 753 and 754, dummy memory cells 755 and 756, and SGD transistors 757 and 758.

NAND string 730n includes SGS transistors 760 and 761, dummy memory cells 762 and 763, data memory cells 764, 765, 766, 767, 768, 769, 770, 771, 772, 773 and 774, dummy memory cells 775 and 776, and SGD transistors 777 and 778.

FIG. 6B depicts a perspective view of sub-blocks SB0-SB3 consistent with FIG. 6A. A sub-block is a portion of a block and represents a set of memory strings which are programmed together and which have a common SGD line. Also, each memory string in a sub-block is connected to a different bit line, in one approach.

Example memory cells are depicted which extend in the x direction along word lines in each sub-block. Each memory cell is depicted as a cube for simplicity. SB0 includes NAND strings 700n, 701n, 702n and 703n. SB1 includes NAND strings 710n, 711n, 712n and 713n. SB2 includes NAND strings 720n, 721n, 722n and 723n. SB3 includes NAND strings 730n, 731n, 732n and 733n. Bit lines are connected to sets of NAND strings. For example, a bit line BL0 is connected to NAND strings 700n, 710n, 720n and 730n, a bit line BL1 is connected to NAND strings 701n, 711n, 721n and 731n, a bit line BL2 is connected to NAND strings 702n, 712n, 722n and 732n, and a bit line BL3 is connected to NAND strings 703n, 713n, 723n and 733n. A sense circuit may be connected to each bit line. For example, sense circuits 400, 400a, 400b and 400c are connected to bit lines BL0, BL1, BL2 and BL3, respectively. The NAND strings are examples of vertical memory strings which extend upward from a substrate.

Programming and reading can occur for selected cells of one word line and one sub-block at a time. This allows each selected cell to be controlled by a respective bit line. For example, an example set 795 of memory cells (including an example memory cell 780) in SB0 is connected to WLL4. Similarly, the sets 796, 797 and 798 comprise data memory cells in SB1, SB2 and SB3 are connected to WLL4.

FIG. 7A depicts an example threshold voltage (Vth) distribution of a set of memory cells, where four data states are used. The set of memory cells may be connected to a common word line. The Vth distribution is obtained after a programming operation. A Vth distribution 800 is provided for erased (Er) state memory cells. Three Vth distributions 801, 802 and 803 represent assigned data states A, B and C, respectively, which are reached by memory cells when their Vth exceeds the erase-verify voltage VvA, VvB or VvC, respectively. This example uses four data states. Other numbers of data states can be used as well, such as eight or sixteen. Read voltages VrA, VrB and VrC are used to read data from a set of cells having this Vth distribution. An erase-verify voltage VvEr is used in an erase-verify test to determine whether the erase operation is completed.

A programming operation can use one or more programming passes. A one pass programming operation involves one sequence of multiple program-verify operations (or program loops) which are performed starting from an initial Vpgm level and proceeding to a final Vpgm level until the threshold voltages of a set of selected memory cells reach the verify voltages of the assigned data states. All memory cells may initially be in the erased state at the beginning of the programming pass. After the programming pass is completed, the data can be read from the memory cells using read voltages which are between the Vth distributions. At the same time, a read pass voltage, Vpass (e.g., 8-10 V), is applied to the remaining word lines. By testing whether the Vth of a given memory cell is above or below one or more of the read reference voltages, the system can determine the data state which is represented by a memory cell. These voltages are demarcation voltages because they demarcate between Vth ranges of different data states.

FIG. 7B depicts an example Vth distribution of a set of memory cells, where eight data states are used. For the Er, A, B, C, D, E, F and G states, we have Vth distributions 820, 821, 822, 823, 824, 825, 826 and 827, respectively program-verify voltages VvA, VvB, VvC, VvD, VvE, VvF and VvG, respectively, and read voltages VrA, VrB, VrC, VrD, VrE, VrF and VrG, respectively. An erase-verify voltage VvEr is used during an erase operation.

Figure 8:
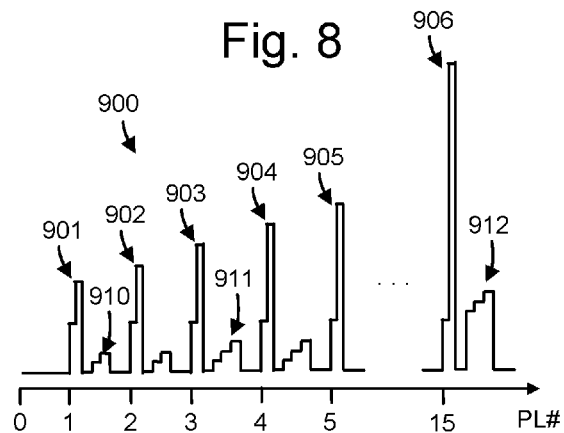
FIG. 8 depicts a waveform of an example programming operation.

FIG. 8 depicts a waveform of an example programming operation. The horizontal axis depicts a program loop (PL) number and the vertical axis depicts control gate or word line voltage. Generally, a programming operation can involve applying a pulse train to a selected word line, where the pulse train includes multiple program loops or program-verify iterations. The program portion of the program-verify iteration comprises a program voltage, and the verify portion of the program-verify iteration comprises one or more verify voltages.

Each program voltage includes two steps, in one approach. Further, Incremental Step Pulse Programming (ISPP) is used in this example, in which the program voltage steps up in each successive program loop using a fixed or varying step size. This example uses ISPP in a single programming pass in which the programming is completed. ISPP can also be used in each programming pass of a multi-pass operation.

The waveform 900 includes a series of program voltages 901, 902, 903, 904, 905, . . . 906 that are applied to a word line selected for programming and to an associated set of non-volatile memory cells. One or more verify voltages can be provided after each program voltage as an example, based on the target data states which are being verified. 0 V may be applied to the selected word line between the program and verify voltages. For example, A- and B-state verify voltages of VvA and VvB, respectively, (waveform 910) may be applied after each of the program voltages 901 and 902. A-, B- and C-state verify voltages of VvA, VvB and VvC (waveform 911) may be applied after each of the program voltages 903 and 904. After several additional program loops, not shown, E-, F- and G-state verify voltages of VvE, VvF and VvG (waveform 912) may be applied after the final program voltage 906.

Figure 9A:
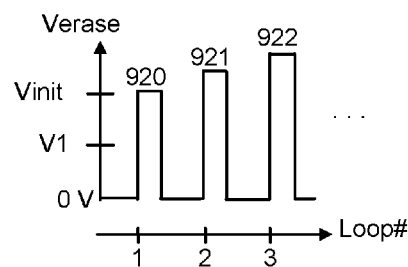
FIG. 9A depicts a plot of erase voltages in an example erase operation.

FIG. 9A depicts a plot of erase voltages in an example erase operation. The erase voltages can be applied to the source end of a set of memory strings via a substrate, and/or to the drain end of the set of memory strings via bit lines. The erase voltages can be applied to the substrate via a local interconnect. The vertical axis depicts Verase and the horizontal axis depicts the erase loop number. Verase has an initial magnitude of Verase1 and steps up in magnitude in each successive erase loop, e.g., to Verase2, Verase3 and so forth. Three loops are shown as an example. Erase voltages 920, 921 and 922 are applied in the erase loops 1, 2 and 3, respectively. Verase1, Verase2, Verase3 and so forth is the peak voltage applied to the substrate and/or bit line in an erase loop.

Figure 9B:
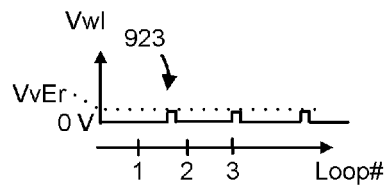
FIG. 9B depicts a plot of erase-verify voltages applied to word lines in a block, consistent with the example of FIG. 9A.

FIG. 9B depicts a plot of erase-verify voltages applied to word lines in a block, consistent with the example of FIG. 9A. The vertical axis depicts Vwl (word line voltage) and the horizontal axis depicts the erase loop number. An example erase-verify voltage 923 is depicted. This voltage (VvEr) may have a magnitude near 0 V, for example. An erase-verify voltage is typically applied after each erase voltage as part of an erase-verify test of a block.

FIG. 10 depicts an example Vth distribution of a set of SGD transistors with and without a disturb. Plot 1000 depicts the case of no disturb, and this may represent a set of SGD transistors in a fresh memory device. Plot 1000d depicts the case of a disturb (Vth increase), and this may represent a set of SGD transistors in a cycled memory device. In stacked 3D memory devices, the disturb increases as program-erase cycles are performed. A similar disturb problem can occur for the SGS transistors if they have a charge trapping layer. SGD disturb occurs during erase operations, and is more severe when the erase voltage is higher. There are two potential mechanisms for the SGD disturb. One or both can be present in varying degrees in a given type of memory device. The memory device can be tested for both mechanisms to see which is more prominent. A corresponding solution can be provided as described herein.

In a first mechanism, if the SGD bias is applied directly at the beginning of the erase operation, there are very few carriers (holes) inside the channel. That is, the channel is not charged up very much relative to its peak charged up level. When the biases are applied on the SGD line (e.g., 12 V) and the neighboring word line (e.g., 0 V), the channel potentials under the SGD line and the adjacent word line are coupled and determined by the respective biases. There will be a channel potential difference in that area which generates electron-hole pairs inside the polysilicon channel. The electrons can be accelerated and injected into the charge trapping layer of the SGD transistors, causing SGD disturb, as depicted in FIG. 11A.

In a second mechanism for SGD disturb, the SGD bias is not sufficiently high at the beginning of the erase operation, and the channel potential under the SGD gate is also low. In this case, the channel region between the SGD gate and the n+ bit line contact area (in DL19) has a large electric field, which can cause strong electron-hole generation. The electrons can be accelerated and injected into the charge trapping layer near the SGD gate, as depicted in FIG. 11B.

FIG. 11A depicts a plot of a channel voltage versus memory string position during an erase operation, showing a channel gradient which injects electrons into an SGD transistor in a first disturb mechanism. A portion of the memory string 700n and its channel 700a of FIG. 6A is depicted. The string 700n includes a data memory cell 714 connected to WLL10, dummy memory cells 715 and 716 connected to WLD1 and WLD2, respectively, and SGD transistors 717 and 718 connected to SGD1 and SGD0, respectively. Plots 1101, 1102 and 1103 represent a voltage along the length of the channel. If we assume the erase voltage has just been applied to the substrate and to the bit line (BL0), the channel voltage adjacent to the transistors 714-716 will be relatively low because it has not yet been fully charged up, and the channel voltage adjacent to the transistors 717 and 718 will be relatively high because this channel region is close to the metal bit line which is charged up very quickly due to its low resistance.

The channel gradient represented by the plot 1102 generates electron-hole pairs in the channel. The electrons can be accelerated and injected into the charge trapping layer of the channel region 665a adjacent to SGD1, causing a disturb. Example electrons are denoted by "−" and holes are denoted by "+". Eventually, the channel voltage uniformly reaches a charge up level which is close to Verase. The channel is fully charged up at this point so that erasing of the memory cells can occur. The techniques provided herein can reduce the SGD disturb by increasing the level of the plot 1101, thereby decreasing the gradient of the plot 1102. In particular, the voltage on WLD2 is temporarily increased when the erase is initially applied. See Vwl_adj in FIG. 13C. The channel region of WLD2 is coupled higher when the voltage on WLD2 is temporarily increased.

Example waveforms of a solution are provided in FIG. 13A-13D. This solution involves, at the beginning of the erase operation, ramping up the bias on the word line (e.g., a dummy word line) which is adjacent to an SGD line (e.g., SGD1 and/or SGS1 in FIG. 6A). In one approach, a same or similar bias level is used for this adjacent word line (Vwl_adj_peak in FIG. 13C) and the SGD line (Vsgd/Vsgs_peak1 in FIG. 13B0. Similarly, the solution can include ramping up the bias on the word line (e.g., a dummy word line) which is adjacent to an SGS line. In one approach, a same or similar bias level is used for this adjacent word line and the SGS line. This can be the same bias as for the SGD line as well, in one possible approach.

During this ramping up time, the potential difference between a region of the channel of the adjacent word line and region of the channel of the select gate transistor will be relatively small. Subsequently, the solution includes ramping down the voltages of the adjacent word line (e.g., WLD2 and/or WLD4 in FIG. 6A) to the normal target bias level (e.g., 0-0.5 V). At this time, there is a large number of holes in the channel so that the channel is highly charged up. As a result, when the voltages of the adjacent word line or lines are ramped down, the channel potential under those lines will not be coupled down. This approach reduces the channel gradient between the select gates and the adjacent word lines to reduce the disturb.

With this approach, it is possible that the gradient is temporarily shifted to between the adjacent word line and the next word line (e.g., between WLD2 and WLD1, respectively, and/or between WLD4 and WLD3, respectively) and that some electrons generated at this shifted gradient are injected into the dummy memory cells of the adjacent word line (WLD4). However, any disturb of these cells will be removed when the adjacent word line bias is subsequently lowered to erase the associated cells.

FIG. 11B depicts a plot of a channel voltage versus memory string position during an erase operation, showing a channel gradient which injects electrons into a region near an SGD transistor in a second disturb mechanism. Plots 1101a, 1102a and 1103a represent a voltage along the length of the channel. If we assume the erase voltage has just been applied to the substrate and to the bit line (BL0), the channel voltage adjacent to the transistors 714-718 will be relatively low because it has not yet been fully charged up, and the channel voltage on the drain side of the SGD transistors (see channel region 665b, adjacent to the dielectric layer DL19) will be relatively high because it is close to the metal bit line which is charged up very quickly.

The channel gradient represented by the plot 1102a generates electron-hole pairs in the channel. The electrons can be accelerated and injected into the charge trapping layer of the channel region 665b, causing a disturb. The techniques provided herein can reduce the SGD disturb by increasing the level of the plot 1101a, thereby decreasing the gradient of the plot 1102a. In particular, the voltage on SGD0 is temporarily increased to a peak level when the erase is initially applied. See Vsgd/Vsgs in FIG. 13E. The voltage on SGD1 can also be temporarily increased to a peak level, as can the voltage on WLD2.

Example waveforms of a solution are provided in FIGS. 13A and 13C-13E. This solution involves, at the beginning of the erase operation, ramping up the bias on the SGD and/or SGS lines to a temporary peak level (Vsgd/Vsgs_peak1, Vsgd/Vsgs_peak2 in FIG. 13E) which is higher than a final target bias level (Vsgd/Vsgs_int in FIG. 13E). At the same time, the bias on the adjacent word line is ramped up to a level (Vwl_adj_peak in FIG. 13C) which is the same or similar as the final target bias level.

During this time, the channel gradient near the select gate transistors will be relatively small. Subsequently, the solution includes ramping down the voltages of the adjacent word line to its normal target bias level (e.g., 0 V) and ramping down the voltages of the select gate line to its normal target bias level (e.g., Vsgd/Vsgs_int). As before, the channel is highly charged up when the word line voltages are lowered so that the channel potential under those lines will not be coupled down. This approach reduces the channel gradient between the SGD select gates and the n+ bit line contact region to reduce the disturb, on the drain side of the memory strings. Similarly, on the source side of the memory strings, the channel gradient between the SGS select gates and the n+ contact region can be reduced.

Figure 12:
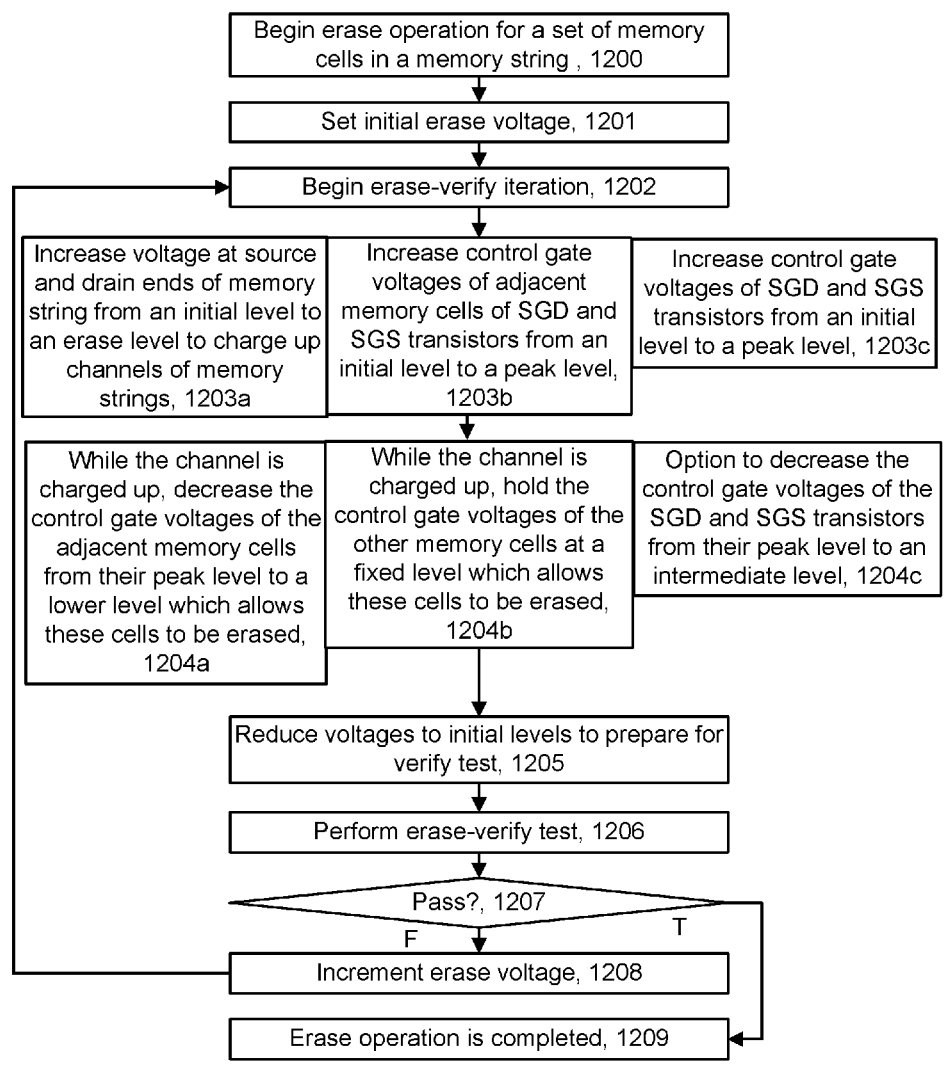
FIG. 12 depicts an example process for performing an erase operation.

FIG. 12 depicts an example process for performing an erase operation. Step 1200 begins an erase operation for a set of memory cells in a memory string. The erase operation may involve memory strings in a block, for instance. Step 1201 sets an initial erase voltage (Verase1 in FIG. 9A). Step 1202 begins an erase-verify iteration.

Steps 1203a, 1203b and 1203c may be performed concurrently, at least in part. Step 1203a includes increasing a voltage at source and drain ends of memory string from an initial level to an erase level to charge up channels of the memory strings. An example is plot 1320 and 1321 in FIG. 13A at t1 and t3, respectively. The source and drain end voltages can be the same or similar, e.g., within +/−10%. The initial level could be, e.g., 0 V and the erase level could be, e.g., 20-25 V. Step 1203b includes increasing control gate voltages of adjacent memory cells of the SGD and/or SGS transistors from an initial level to a peak level. An example is plot 1324 and 1325 in FIG. 13C at t1 and t3, respectively. The adjacent memory cells can be dummy or data memory cells. For example, in FIG. 6A, the dummy memory cells of WLD2 are adjacent to the SGD transistors of SGD1. The initial level could be, e.g., 0 V and the peak level could be, e.g., 12-16 V. Step 1203c includes increasing control gate voltages of the SGD and SGS transistors from an initial level to a peak level. An example is plot 1322 and 1323 in FIG. 13B at t1 and t3, respectively. Another example is plot 1328 and 1329 in FIG. 13E at t1 and t3, respectively. This can involve one or more SGD transistors at the drain end of each memory string and/or one or more SGS transistors at the source end of each memory string. The initial level could be, e.g., 0 V and the peak level could be, e.g., 12-a6 V. In another option, the increasing of the control gate voltages of SGD and SGS transistors involves floating the voltages instead of driving them, in which case the control gate voltages of the SGD and SGS transistors float higher to about 12 V, for example.

Subsequently, steps 1204a, 1204b and 1204c may be performed concurrently, at least in part. Step 1204a includes, while the channel is charged up, e.g., to its peak level, decreasing the control gate voltages of the adjacent memory cells from their peak level to a lower level which allows these cells to be erased. An example is plot 1324 and 1325 in FIG. 13C at t1a and t3a, respectively. The control gate voltages of the adjacent memory cells can be held at the fixed level which allows these cells to be erased. Step 1204b includes, while the channel is charged up, holding the control gate voltages of the other memory cells at a fixed level which allows these cells to be erased. This can be the same fixed level at which the adjacent memory cells are held, e.g., 0-0.5 V. An example is plot 1326 and 1327 in FIG. 13D at t1-t2 and t3-t4, respectively. The other memory cells can be non-adjacent cells of the SGD transistors. For example, in FIG. 6A, the memory cells of WLD3 to WLD1 are non-adjacent to the SGD transistors of SGD0 and SGD1 and to the to the SGS transistors of SGS0 and SGS1. Step 1204c includes an option to decrease the control gate voltages of the SGD and SGS transistors from their peak level to an intermediate level. An example is plot 1328 and 1329 in FIG. 13E at t1a and t3a, respectively. If this option is not used, another option is to decrease the control gate voltages of the SGD and SGS transistors from their peak level to their initial level such as 0 V in step 1205. An example is plot 1322 and 1323 in FIG. 13B at t2 and t4, respectively.

Step 1205 includes reducing the voltages of the various word lines and select gate lines to their initial levels to prepare for a verify test. See, e.g., t2 and t4 in FIG. 13A-13E. Step 1206 includes performing an erase-verify test, e.g., using VvEr in FIG. 7A or 7B. A decision step 1207 determines if the verify test is passed. If decision step 1207 is true, the erase operation is completed at step 1209. If decision step 1207 is false, the erase voltage is incremented at step 1208 and a next erase-verify iteration (erase loop) begins at step 1202.

Figures 13A, 13B, 13C, 13D:
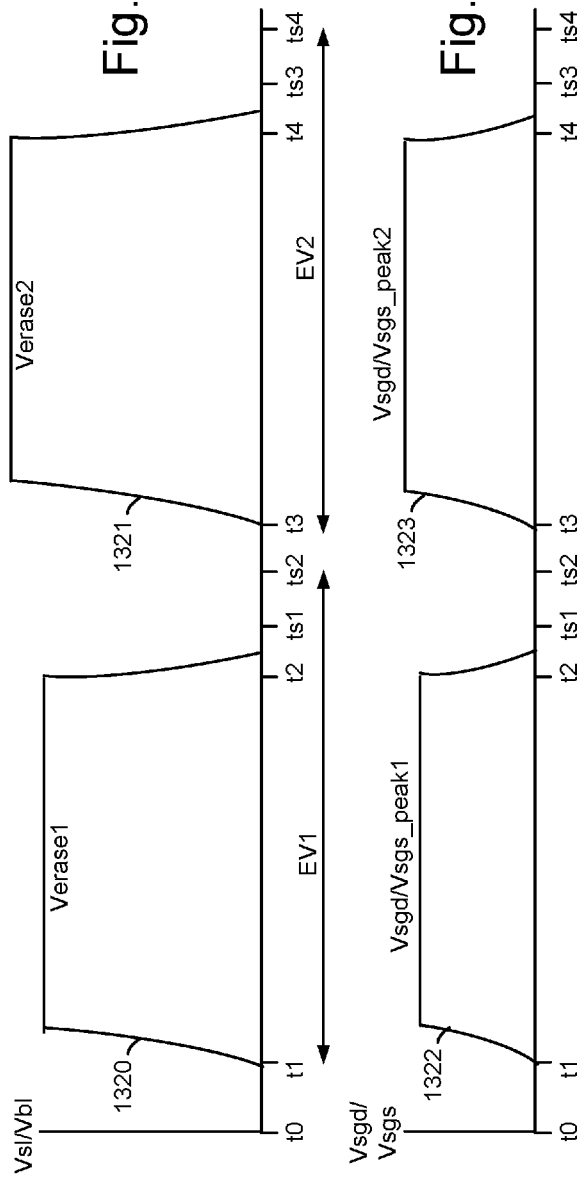
FIG. 13A to 13E depict voltages in one example of an erase operation, where
Figure 13E:
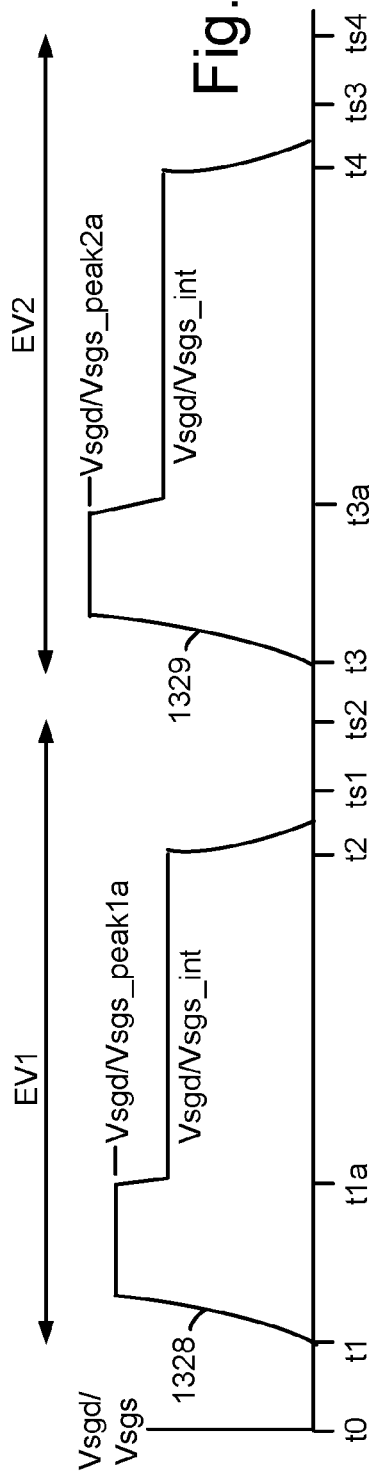

FIG. 13A to 13E depict voltages in one example of an erase operation, where FIG. 13A depicts a source line voltage (Vsl) and a bit line voltage (Vbl), FIG. 13B depicts one option for a drain side select gate voltage (Vsgd) and a source side select gate voltage (Vsgs), FIG. 13C depicts a word line voltage (Vwl_adj) for a word line which is adjacent to an SGD control line, FIG. 13D depicts a word line voltage (Vwl_non-adj) for word lines which are non-adjacent to an SGD control line, and FIG. 13E depicts another option for Vsgd and Vsgs.

The horizontal axes denote time. First and second erase-verify iterations, EV1 and EV2, respectively, of an erase operation are depicted. Additional erase-verify iterations or loops could be used as well. In EV1, plot 1320 shows that Vsl and Vbl are increased from a respective initial level of 0 V to a respective peak level of Verase1 (e.g., 20 V or more) at t1. This charges up the channel to a level which is slightly less than Verase1. In EV2, plot 1321 shows that Vsl and Vbl are increased from the initial level to Verase2>Verase1, for instance, consistent with FIG. 9A. This is an example of Verase increasing with erase loop number. See also FIG. 14B. Vsl and Vbl are decreased from the erase levels of Verase1 and Verase2 to the initial level at t2 and t4, respectively.

Also at t1, Vsgd and Vsgs increase from a respective initial level such as 0 V to a respective peak level of Vsgd/Vsgs_peak1 (plot 1322). At t3, Vsgd and Vsgs increase from the respective initial level to a respective peak level of Vsgd/Vsgs_peak2>Vsgd/Vsgs_peak1 (plot 1322). This is an example of Vsgd/Vsgs_peak increasing with Verase or erase loop number. See also FIGS. 14A and 14B. In another option, Vsgd/Vsgs_peak is fixed in the different erase loops. At t2 and t4, Vsgd and Vsgs decrease from the respective peak level to the initial level. Increasing Vsgd and Vsgs to a large positive level allows the channel to be charged up by Verase and avoids a large channel-to-gate voltage which could erase or otherwise stress the SGD and SGS transistors.

Figure 14A:
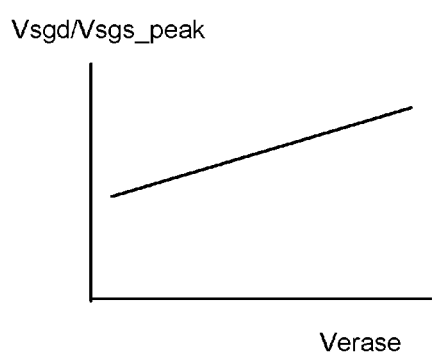
FIG. 14A depicts a plot of Vsgd/Vsgs_peak in FIG. 13B or 13E versus Verase in FIG. 13A.
Figure 14B:
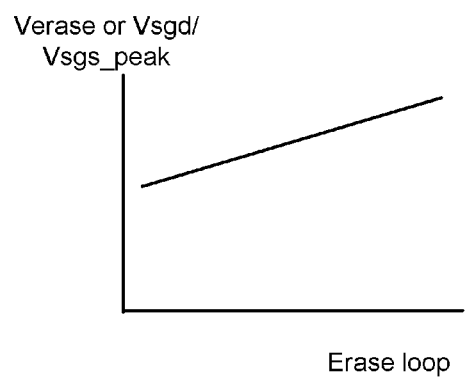
FIG. 14B depicts a plot of Verase in FIG. 13A or Vsgd/Vsgs_peak in FIG. 13B or 13E versus erase loop.

At t1 and t3, Vwl_adj (the voltage of the word line which is adjacent to the SGD transistors, such as WLD2 which is adjacent to SGD1 in FIG. 6A, and/or the voltage of the word line which is adjacent to the SGS transistors, such as WLD4 which is adjacent to SGS1 in FIG. 6A) increase from a respective initial level such as 0 V to a respective peak level of Vwl_adj_peak, which can be equal or similar to Vsgd/Vsgs_peak, for instance (plots 1324 and 1325). At t1a and t3a, Vwl_adj decreases from the respective peak level to a lower level, e.g., 0.5-1 V, and is held at that level from t1a-t2 or t3a-t4, respectively. This is a level which allows the associated memory cells to be erased. Increasing Vwl_adj temporarily when the channel is being charged up by Verase helps reduce a gradient in the channel which could cause a disturb of the SGD1 transistors, as discussed, e.g., in connection with FIG. 11A. Vwl_adj is held at the peak level for a relatively small time period compared to the time period of the erase voltage. This is sufficient to reduce the channel gradient when the channel is weakly boosted and a disturb is most likely to occur. As the channel becomes charged up due to Verase, Vwl_adj can be set to the lower level. The time period or duration for Vwl_adj_peak (e.g., t1-t1a) can also be a function of temperature, as depicted in FIG. 14D.

At t1-t2 and t3-t4, Vwl_non-adj (the word lines which are not adjacent to the SGD or SGS transistors, such as WLD3 to WLD1 in FIG. 6A) are held at a similar lower level, e.g., 0.5-1 V, which allows the associated memory cells to be erased (plots 1326 and 1327).

In the option of FIG. 13E, Vsgd and Vsgs are increases to a peak level and then to an intermediate level where they are held for the remainder of the erase voltage, Verase. Moreover, this peak level can be a function of Verase or loop number, such as depicted in FIGS. 14A and 14B. Further, the time period or duration of this peak level can be a function of temperature, such as depicted in FIG. 14D. In one implementation, this peak level has the same duration as the peak level of Vwl_adj_peak in FIG. 13C.

At t1, Vsgd and Vsgs increase from a respective initial level such as 0 V to a respective peak level of Vsgd/Vsgs_peak1a (plot 1328). At t3, Vsgd and Vsgs increase from the respective initial level to a respective peak level of Vsgd/Vsgs_peak2a>Vsgd/Vsgs_peak1a (plot 1329). This is an example of Vsgd/Vsgs_peak increasing with Verase or erase loop number. See also FIGS. 14A and 14B. At t1a and t3a, Vsgd and Vsgs decrease from the respective initial level to an intermediate level of Vsgd/Vsgs_int and are held at the intermediate level from ta1-t2 and t3a-t4. In one approach, this intermediate level is the same in each erase loop. In another possible approach, the intermediate level increases with Verase and loop number.

In one implementation, Vsgd/Vsgs_int is the same or similar as Vsgd/Vsgs_peak1 in FIG. 13B, e.g., 12 V. Vsgd/Vsgs_peak1a may be a higher level such as 16 V.

Increasing Vsgd/Vsgs temporarily when the channel is being charged up by Verase helps reduce a gradient in the channel which could cause a disturb, as discussed, e.g., in connection with FIG. 11B. Vsgd/Vsgs is held at the peak level for a relatively small time period compared to the time period of the erase voltage. This is sufficient to reduce the channel gradient when the channel is weakly boosted and a disturb is most likely to occur. As the channel becomes charged up, Vsgd/Vsgs can be set to a lower level. The time period or duration for Vsgd/Vsgs_peak (e.g., t1-t1$a$ or t3-t3$a$) can also be a function of temperature, as depicted in FIG. 14D.

The verify tests of EV1 and EV2 occur during ts1-ts2 and ts3-ts4, respectively.

Both dummy and data memory cells can be erased. In some implementations, dummy memory cells are not used.

Note that Vsl and Vbl are shown as having a common peak level of Verase in this example, but in other examples they may have different peak levels. The erase levels in general are sufficiently high to charge up the channel to a level which is suitable for erasing the memory cells. Similarly, Vsgd and Vsgs are shown as having a common peak level, but in other examples they may have different peak levels.

FIG. 14A depicts a plot of Vsgd/Vsgs_peak in FIG. 13B or 13E versus Verase in FIG. 13A. By increasing Vsgd/Vsgs_peak with Verase, the channel gradient between the SGD transistors and the bit line will be reduced so that the electron injection of FIG. 11B on the drain side of the SGD transistors will be less likely.

FIG. 14B depicts a plot of Verase in FIG. 13A or Vsgd/Vsgs_peak in FIG. 13B or 13E versus erase loop. Verase can increase with erase loop number to provide a stronger erase which ensures that the erase operation completes within a small number of erase loops. Increasing Vsgd/Vsgs_peak with the erase loop number has the same benefit as increasing Vsgd/Vsgs_peak with Verase.

Figure 14C:
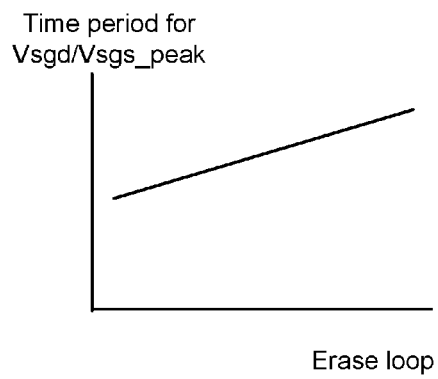
FIG. 14C depicts a plot of a time period for Vsgd/Vsgs_peak in FIG. 13E versus erase loop.
Figure 14D:
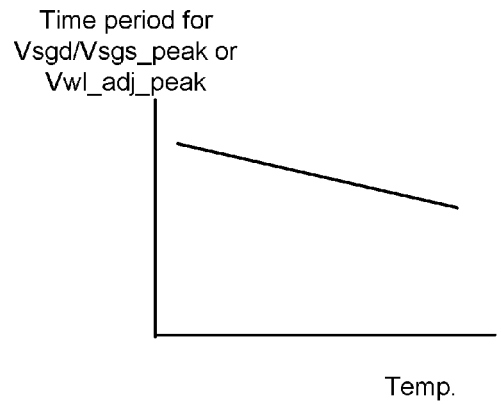
FIG. 14D depicts a plot of a time period for Vsgd/Vsgs_peak in FIG. 13E or Vwl_adj_peak in FIG. 13C versus temperature.

FIG. 14C depicts a plot of a time period for Vsgd/Vsgs_peak in FIG. 13E versus erase loop. Increasing the time period of Vsgd/Vsgs_peak allows more time for the channel to charge up to its peak level. Additional time may be needed for the charge up as Verase increases in the successive erase loops. This reduces the likelihood of a disturb as in FIG. 11A or 11B.

FIG. 14D depicts a plot of a time period for Vsgd/Vsgs_peak in FIG. 13E or Vwl_adj_peak in FIG. 13C versus temperature. The charging up (increasing the voltage) of the channel can occur more quickly at higher temperatures so that the benefit of Vsgd/Vsgs_peak can achieved in a shorter time period. The time period for Vwl_adj_peak can similarly be reduced at higher temperatures.

Figure 15:
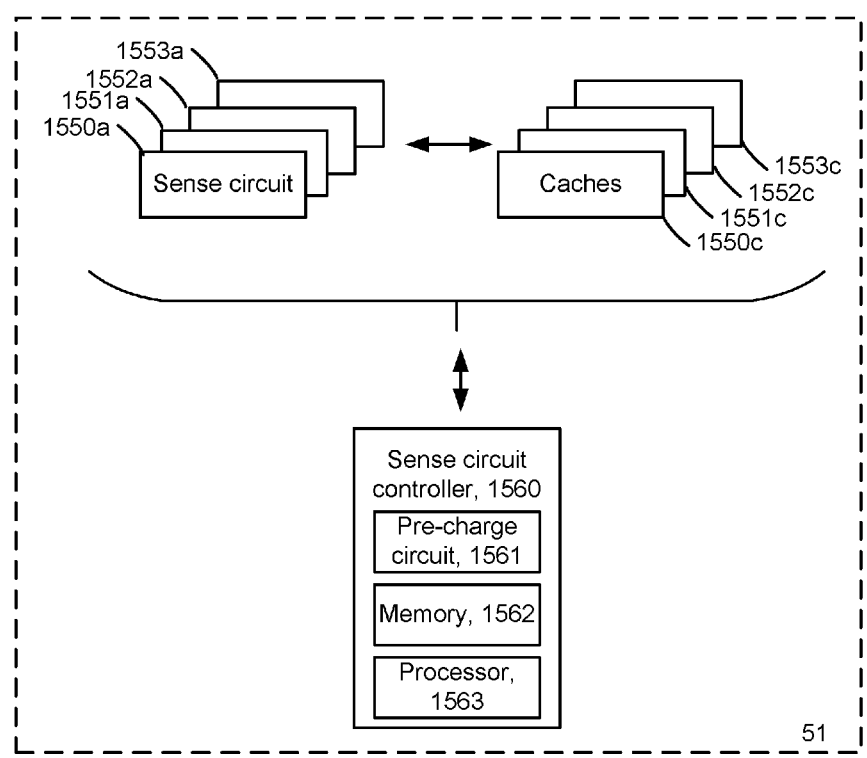
FIG. 15 depicts an example block diagram of a sense block 51 in the column control circuitry of FIG. 1A.

FIG. 15 depicts an example block diagram of a sense block 51 in the column control circuitry of FIG. 1A. The column control circuitry can include multiple sense blocks, where each sense block performs sensing, e.g., read, program-verify or erase-verify operations for multiple memory cells via respective bit lines.

In one approach, a sense block comprises multiple sense circuits, also referred to as sense amplifiers. Each sense circuit is associated with data latches and caches. For example, the example sense circuits 1550$a$, 1551$a$, 1552$a$ and 1553$a$ are associated with caches 1550$c$, 1551$c$, 1552$c$ and 1553$c$, respectively.

In one approach, different subsets of bit lines can be sensed using different respective sense blocks. This allows the processing load which is associated with the sense circuits to be divided up and handled by a respective processor in each sense block. For example, a sense circuit controller 1560 can communicate with the set, e.g., sixteen, of sense circuits and latches. The sense circuit controller may include a pre-charge circuit 1561 which provides a voltage to each sense circuit for setting a pre-charge voltage. The sense circuit controller may also include a memory 1562 and a processor 1563.

Further example details of the sense circuit controller and the sense circuits are provided below.

Figure 16:
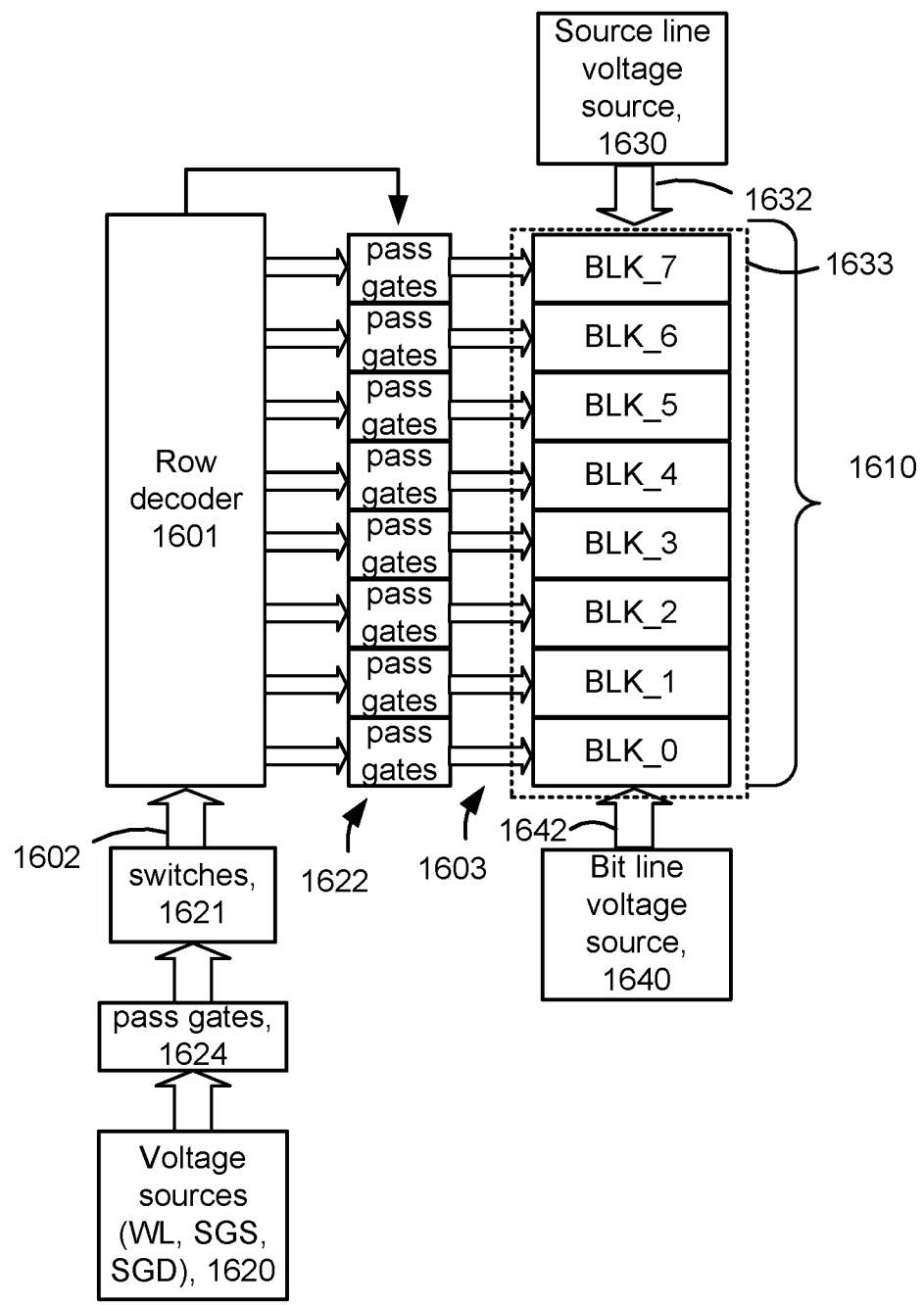
FIG. 16 depicts an example circuit for providing voltages to blocks of memory cells.

FIG. 16 depicts an example circuit for providing voltages to blocks of memory cells. In this example, a row decoder 1601 provides voltages to word lines and select gates of each block in set of blocks 1610. The set could be in a plane and includes blocks BLK0 to BLK7, for instance. The row decoder provides a control signal to pass gates 1622 which connect the blocks to the row decoder. Typically, operations, e.g., program, read or erase, are performed on one selected block at a time. The row decoder can connect global control lines 1602 to local control lines 1603. The control lines represent conductive paths. Voltages are provided on the global control lines from voltage sources 1620. The voltage sources may provide voltages to switches 1621 which connect to the global control lines. Pass gates 1624, also referred to as pass transistors or transfer transistors, are controlled to pass voltages from the voltage sources 1620 to the switches 1621.

The voltage sources 1620 can provided voltages on data and dummy word lines (WL) and dummy word line portions, SGS layers and SGD layer portions, for example.

The various components, including the row decoder, may receive commands from a controller such as the state machine 112 or the controller 122 to perform the functions described herein.

A source line voltage source 1630 provides a voltage to the source lines/diffusion region in the substrate via control lines 1632. In one approach, the source diffusion region 1633 is common to the blocks. A set of bit lines 1642 is also shared by the blocks. A bit line voltage source 1640 provides voltages to the bit lines. In one possible implementation, the voltage sources 1620 are near the bit line voltage source.

In one embodiment, an apparatus comprises: a memory string comprising a set of memory cells between a source end of the memory string and a drain end of the memory string, a select gate transistor at the drain end (e.g., one or more SGD transistors), and a channel extends from the source end to the drain end, wherein the set of memory cells comprises a memory cell adjacent to the select gate transistor as an adjacent memory cell, and other memory cells; and a control circuit. The control circuit, to perform an erase operation for the set of memory cells, is configured to: increase a voltage at the source end, from a respective initial level to an erase level which charges up the channel; during the increase of the voltage at the source end, increase a control gate voltage of the adjacent memory cell, from a respective initial level to a respective peak level, and increase a control gate voltage of the select gate transistor, from a respective initial level to a respective peak level; and while the channel is charged up, decrease the control gate voltage of the adjacent memory cell, from the respective peak level to a respective lower level and hold the control gate voltage of the adjacent memory cell at the respective lower level to erase the adjacent memory cell, and hold control gate voltages of the other memory cells at a respective fixed level to erase the other memory cells.

In another embodiment, a method for erasing memory cells comprises: charging up a channel of a memory string, wherein the memory strings comprises a set of memory cells between a source end of the memory string and a drain end of the memory string, and a select gate transistor at the drain end, wherein the channel extends from the source end to the drain end, the set of memory cells comprises other memory cells and an adjacent memory cell, and the adjacent memory cell is adjacent to the select gate transistor; during the charging up of the channel, increasing a control gate voltage of the adjacent memory cell, from a respective initial level to a respective peak level, and increasing a control gate voltage of the select gate transistor, from a respective initial level to a respective peak level; and subsequently, decreasing the control gate voltage of the adjacent memory cell, from the respective peak level to a respective lower level and holding the control gate voltage of the adjacent memory cell at the respective lower level to erase the adjacent memory cell, and holding control gate voltages of the other memory cells at a respective fixed level to erase the other memory cells.

In another embodiment, an apparatus comprises: a memory string comprising a set of memory cells between a source end of the memory string and a drain end of the memory string, wherein the drain end comprises a select gate transistor, and a channel extends between the source end and the drain end, the set of memory cells further comprises other memory cells and an adjacent memory cell, and the adjacent memory cell is adjacent to the select gate transistor; means for charging up the channel; means for, during the charging up of the channel, increasing a control gate voltage of the adjacent memory cell, from a respective initial level to a respective peak level, and increasing a control gate voltage of the select gate transistor, from a respective initial level to a respective peak level; means for decreasing the control gate voltage of the adjacent memory cell, from the respective peak level to a respective lower level; means for holding the control gate voltage of the adjacent memory cell at the respective lower level to erase the adjacent memory cell; and means for holding control gate voltages of the other memory cells at a respective fixed level to erase the other memory cells.

The means described above can include the components of the memory device 100 of FIG. 1 and FIG. 2, for example. The power control module 116, for instance, controls the power and voltages supplied to the word lines, select gate lines and bit lines during memory operations. Moreover, the means described above can include the components of FIG. 16 including the decoders, voltage drivers, switches and pass transistors. The means can further include any of the control circuits in FIG. 1A such as the control circuitry 110 and controller 122.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
 a memory string comprising a set of memory cells between a source end of the memory string and a drain end of the memory string, a select gate transistor at the drain end, and a channel extending from the source end to the drain end, wherein the set of memory cells comprises a memory cell adjacent to the select gate transistor as an adjacent memory cell, and other memory cells; and
 a control circuit, the control circuit, to perform an erase operation for the set of memory cells, is configured to:
  increase a voltage at the source end, from a respective initial level to an erase level which charges up the channel;
  during the increase of the voltage at the source end, increase a control gate voltage of the adjacent memory cell, from a respective initial level to a respective peak level, and increase a control gate voltage of the select gate transistor, from a respective initial level to a respective peak level; and
  while the channel is charged up, decrease the control gate voltage of the adjacent memory cell, from the respective peak level to a respective lower level and hold the control gate voltage of the adjacent memory cell at the respective lower level to erase the adjacent memory cell, and hold control gate voltages of the other memory cells at a respective fixed level to erase the other memory cells.

2. The apparatus of claim 1, wherein:
 the control circuit, to perform the erase operation, is configured to hold the control gate voltage of the select gate transistor at the respective peak level during the hold of the control gate voltage of the adjacent memory cell at the respective lower level and the hold of the control gate voltages of the other memory cells at the respective fixed level.

3. The apparatus of claim 2, wherein:
 the charge up of the channel occurs, at least in part, during the hold of the control gate voltage of the adjacent memory cell at the respective peak level and during the hold of the control gate voltage of the select gate transistor at the respective peak level.

4. The apparatus of claim 1, wherein:
 the control circuit, to perform the erase operation, is configured to decrease the control gate voltage of the select gate transistor from the respective peak level to an intermediate level which is between the respective peak level and the respective initial level, and hold the control gate voltage of the select gate transistor at the intermediate level during the hold of the control gate voltage of the adjacent memory cell at the respective lower level and during the hold of the control gate voltages of the other memory cells at the respective fixed level.

5. The apparatus of claim 4, wherein:
 the control circuit, to perform the erase operation, is configured to set the respective peak level of the control gate voltage of the select gate transistor as a function of the erase level; and
 the respective peak level of the control gate voltage of the select gate transistor is relatively higher when the erase level is relatively higher.

6. The apparatus of claim 4, wherein:
 the erase operation comprises a plurality of erase loops; and
 the control circuit, to perform the erase operation, is configured to increase the erase level and the respective peak level of the control gate voltage of the select gate transistor over successive erase loops of the plurality of erase loops.

7. The apparatus of claim 4, wherein:
 the erase operation comprises a plurality of erase loops; and the control circuit, to perform the erase operation, is configured to increase the erase level and a time period of the hold the control gate voltage of the select gate transistor at the respective peak level over successive erase loops of the plurality of erase loops.

8. The apparatus of claim 4, wherein:
a time period of the hold the control gate voltage of the select gate transistor at the respective peak level is set based on a temperature; and
the time period is relatively shorter when the temperature is relatively higher.

9. The apparatus of claim 4, wherein:
the decrease of the control gate voltage of the select gate transistor from the respective peak level to the intermediate level occurs during the decrease of the control gate voltage of the adjacent memory cell.

10. The apparatus of claim 1, wherein:
a time period of the hold the control gate voltage of the adjacent memory cell at the respective peak level is set based on a temperature; and
the time period is relatively shorter when the temperature is relatively higher.

11. The apparatus of claim 1, wherein:
the control circuit, to perform the erase operation, is configured to increase a voltage at the drain end, from a respective initial level to an erase level which charges up the channel.

12. The apparatus of claim 1, wherein:
the adjacent memory cell is a dummy memory cell and the other memory cells comprise data memory cells.

13. A method for erasing memory cells, comprising:
charging up a channel of a memory string, wherein the memory strings comprises a set of memory cells between a source end of the memory string and a drain end of the memory string, and a select gate transistor at the drain end, wherein the channel extends from the source end to the drain end, the set of memory cells comprises other memory cells and an adjacent memory cell, and the adjacent memory cell is adjacent to the select gate transistor;
during the charging up of the channel, increasing a control gate voltage of the adjacent memory cell, from a respective initial level to a respective peak level, and increasing a control gate voltage of the select gate transistor, from a respective initial level to a respective peak level; and
subsequently, decreasing the control gate voltage of the adjacent memory cell, from the respective peak level to a respective lower level and holding the control gate voltage of the adjacent memory cell at the respective lower level to erase the adjacent memory cell, and holding control gate voltages of the other memory cells at a respective fixed level to erase the other memory cells.

14. The method of claim 13, wherein:
the charging up the channel comprises increasing a voltage at the source end.

15. The method of claim 13, further comprising:
decreasing the control gate voltage of the select gate transistor from the respective initial level to an intermediate level which is between the respective peak level and the respective initial level; and
holding the control gate voltage of the select gate transistor at the intermediate level during the holding of the control gate voltage of the adjacent memory cell at the respective lower level and during the holding of the control gate voltages of the other memory cells at the respective fixed level.

16. The method of claim 13, further comprising:
holding the control gate voltage of the select gate transistor at the respective peak level during the holding of the control gate voltage of the adjacent memory cell at the respective lower level and the holding of the control gate voltages of the other memory cells at the respective fixed level.

17. An apparatus, comprising:
a memory string comprising a set of memory cells between a source end of the memory string and a drain end of the memory string, wherein the drain end comprises a select gate transistor, and a channel extends between the source end and the drain end, the set of memory cells further comprises other memory cells and an adjacent memory cell, and the adjacent memory cell is adjacent to the select gate transistor;
means for charging up the channel;
means for, during the charging up of the channel, increasing a control gate voltage of the adjacent memory cell, from a respective initial level to a respective peak level, and increasing a control gate voltage of the select gate transistor, from a respective initial level to a respective peak level;
means for decreasing the control gate voltage of the adjacent memory cell, from the respective peak level to a respective lower level;
means for holding the control gate voltage of the adjacent memory cell at the respective lower level to erase the adjacent memory cell; and
means for holding control gate voltages of the other memory cells at a respective fixed level to erase the other memory cells.

18. The apparatus of claim 17, further comprising:
means for decreasing the control gate voltage of the select gate transistor from the respective initial level to an intermediate level which is between the respective peak level and the respective initial level; and
means for holding the control gate voltage of the select gate transistor at the intermediate level during the holding of the control gate voltage of the adjacent memory cell at the respective lower level and during the holding of the control gate voltages of the other memory cells at the respective fixed level.

19. The apparatus of claim 17, further comprising:
holding the control gate voltage of the select gate transistor at the respective peak level during the holding of the control gate voltage of the adjacent memory cell at the respective lower level and the holding of the control gate voltages of the other memory cells at the respective fixed level.

20. The apparatus of claim 17, wherein the means for charging up the channel increases a voltage at the source end from a respective initial level to an erase level, the apparatus further comprising:
means for setting the respective peak level of the control gate voltage of the select gate transistor as a function of the erase level, wherein the respective peak level of the control gate voltage of the select gate transistor is relatively higher when the erase level is relatively higher.

* * * * *